United States Patent
Koshimizu et al.

(10) Patent No.: US 8,858,753 B2
(45) Date of Patent: Oct. 14, 2014

(54) FOCUS RING HEATING METHOD, PLASMA ETCHING APPARATUS, AND PLASMA ETCHING METHOD

(71) Applicant: Tokyo Electron Limited, Tokyo (JP)

(72) Inventors: Chishio Koshimizu, Yamanashi (JP); Jun Yamawaku, Yamanashi (JP); Tatsuo Matsudo, Yamanashi (JP); Masashi Saito, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/942,106

(22) Filed: Jul. 15, 2013

(65) Prior Publication Data

US 2013/0299455 A1 Nov. 14, 2013

Related U.S. Application Data

(62) Division of application No. 12/700,177, filed on Feb. 4, 2010, now Pat. No. 8,486,221.

(60) Provisional application No. 61/242,553, filed on Sep. 15, 2009.

(30) Foreign Application Priority Data

| Feb. 5, 2009 | (JP) | ................................. 2009-024969 |
| Aug. 27, 2009 | (JP) | ................................. 2009-197180 |
| Feb. 2, 2010 | (JP) | ................................. 2010-021079 |

(51) Int. Cl.
- *C23F 1/00* (2006.01)
- *C23F 1/08* (2006.01)
- *H05H 1/24* (2006.01)
- *H01J 37/32* (2006.01)

(52) U.S. Cl.
CPC ............ *H05H 1/24* (2013.01); *H01J 37/32642* (2013.01); *H01J 37/32091* (2013.01); *H01J 37/32522* (2013.01); *H01J 2237/334* (2013.01)
USPC .............. 156/345.37; 156/345.4; 156/345.41; 156/345.42; 156/345.43; 156/345.44; 118/723 VE; 118/723 E; 118/724; 118/723 R; 118/725

(58) Field of Classification Search
USPC ............. 392/416; 156/345.37, 345.4, 345.41, 156/345.42, 345.43, 345.44, 345.45, 156/345.46, 345.47, 345.48; 118/723 VE, 118/723 E, 724, 723 R, 725
See application file for complete search history.

(56) References Cited

U.S. PATENT DOCUMENTS

| 6,676,804 B1 * | 1/2004 | Koshimizu et al. ...... 156/345.53 |
| 2006/0077394 A1 | 4/2006 | Suzuki et al. |
| 2008/0149598 A1 | 6/2008 | Hayashi et al. |

(Continued)

FOREIGN PATENT DOCUMENTS

| JP | 7-161653 A | 6/1995 |
| JP | 10-223575 A | 8/1998 |

(Continued)

*Primary Examiner* — Sylvia R MacArthur
(74) *Attorney, Agent, or Firm* — Rothwell, Figg, Ernst & Manbeck, P.C.

(57) ABSTRACT

There are provided a method of heating a focus ring and a plasma etching apparatus, capable of simplifying a structure of a heating mechanism without a dummy substrate. The plasma etching apparatus includes a vacuum processing chamber; a lower electrode serving as a mounting table for mounting a substrate thereon; an upper electrode provided to face the lower electrode; a gas supply unit for supplying a processing gas; a high frequency power supply for supplying a high frequency power to the lower electrode to generate a plasma of the processing gas; and a focus ring provided on the lower electrode to surround a periphery of the substrate. In the plasma etching apparatus, the focus ring is heated by irradiating a heating light thereto from a light source provided outside the vacuum processing chamber.

17 Claims, 31 Drawing Sheets

(56) References Cited

U.S. PATENT DOCUMENTS

| | | |
|---|---|---|
| 2008/0237182 A1 | 10/2008 | Yamawaku et al. |
| 2010/0012274 A1 | 1/2010 | Miyagawa et al. |
| 2010/0206482 A1 | 8/2010 | Matsudo et al. |
| 2010/0213171 A1 | 8/2010 | Koshimizu et al. |
| 2010/0326957 A1 | 12/2010 | Maeda et al. |
| 2011/0211817 A1 | 9/2011 | Yamawaku et al. |

FOREIGN PATENT DOCUMENTS

| | | |
|---|---|---|
| JP | 2001-57363 A | 2/2001 |
| JP | 2002-319577 A | 10/2002 |
| JP | 2008-159931 A | 7/2008 |

* cited by examiner

FOCUS RING HEATING METHOD, PLASMA ETCHING APPARATUS, AND PLASMA ETCHING METHOD

CROSS REFERENCE TO RELATED APPLICATIONS

This application claims the benefit of priority of each of the following applications and describes the relationship of the earlier applications. The present application is a Divisional application of and claims the benefit of priority from co-pending U.S. application Ser. No. 12/700,177, filed Feb. 4, 2010, and also claims the benefit of priority from U.S. Provisional Application No. 61/242,553, filed Sep. 15, 2009. The present application is further based upon and claims the benefit of priority from the prior Japanese Patent Application Nos. 2009-024969, filed Feb. 5, 2009, 2009-197180, filed Aug. 27, 2009, and 2010-021079, filed Feb. 2, 2010. The entire contents of foregoing applications are incorporated herein by reference.

FIELD OF THE INVENTION

The present invention relates to a method for heating a focus ring provided in a plasma etching apparatus that etches a substrate such as a semiconductor wafer, a glass substrate for a liquid crystal display apparatus, and the like by using a plasma; a plasma etching apparatus; and a plasma etching method.

BACKGROUND OF THE INVENTION

In general, a plasma etching apparatus for etching a substrate such as a semiconductor wafer and a glass substrate for a liquid crystal display apparatus by using a plasma has been employed in a manufacturing process of semiconductor devices, or the like.

The plasma etching apparatus is typically configured to include, e.g., a vacuum processing chamber; a lower electrode provided in the processing chamber, the lower electrode also serving as a mounting table on which a substrate is mounted; and an upper electrode provided to face the lower electrode. A high frequency power is supplied to the lower electrode to generate a plasma of a processing gas. Further, the plasma etching apparatus includes a focus ring provided on the lower electrode to surround a periphery of the substrate in order to improve an in-plane uniformity of processing on the substrate.

Moreover, an inductive heating unit is provided inside the focus ring and the focus ring is inductively heated by a magnetic field generated by an induction coil placed in the vacuum processing chamber (see, e.g., Patent document 1).
[Patent document 1] Japanese Patent Application Publication No. 2008-159931

In the plasma etching apparatus, when a plurality of substrates is successively subjected to the plasma etching, the temperature of the focus ring is gradually increased from a room temperature as the focus ring is exposed to the plasma. For that reason, without dealing with such change of temperature, a first substrate firstly subjected to the plasma etching has a processed state different from those of a second and following substrates subjected to the plasma etching. To prevent the occurrence of such a problem, a plasma is conventionally generated in the vacuum processing chamber while a dummy substrate is mounted on the lower electrode and the focus ring is heated by the plasma, before the start of the processing of substrates.

If a plasma is generated in the vacuum processing chamber while no dummy substrate is mounted, the surface of an electrostatic chuck may be damaged by the plasma, the electrostatic chuck being provided on the lower electrode to electrostatically attract the substrate. Accordingly, as described above, the plasma is generated in the vacuum processing chamber while the dummy substrate is mounted on the lower electrode.

However, if the plasma is generated in the vacuum processing chamber to heat the focus ring by the plasma as described above, the focus ring and other members included in the vacuum processing chamber may be worn out. Further, if the focus ring is heated in this way, it becomes necessary to manage a frequency of using the dummy substrate or the like and provide an accommodation part (slot) for accommodating the dummy substrate.

Moreover, when the inductive heating unit is provided inside the focus ring and the focus ring is inductively heated by the magnetic field generated by the induction coil placed in the vacuum processing chamber, it is needed to provide, in advance, the inductive heating unit in the focus ring and the induction coil in the vacuum processing chamber. Accordingly, the heating mechanism for heating the focus ring has a complex structure, thereby increasing a manufacturing cost.

In the meantime, a processing shape at a peripheral portion of a processing-target substrate, e.g., a semiconductor wafer, may become different from those of other portions in the plasma etching apparatus. For example, when a hole is formed on a semiconductor wafer by a plasma etching, a processing shape at a peripheral portion of the semiconductor wafer may become thinner, thereby causing a diameter of the hole to be decreased. In this case, it is possible to improve the processing shape at the peripheral portion of the semiconductor wafer by cooling a focus ring. However, if the focus ring is cooled, an etching rate of a photoresist may be increased at the peripheral portion of the semiconductor wafer and a corresponding selectivity may be lowered.

SUMMARY OF THE INVENTION

In view of the above, the present invention provides a focus ring heating method and a plasma etching apparatus, in which members inside a vacuum chamber can be suppressed from being worn out without a dummy substrate and a structure of a heating mechanism can be simplified to suppress the increase in a manufacturing cost as compared with a conventional method.

The present invention also provides a plasma etching apparatus and a plasma etching method, which can suppress the deterioration of a processing shape at a peripheral portion of a processing-target substrate and improve an in-plane uniformity of a plasma etching process by suppressing the increase in an etching rate of a photoresist at the peripheral portion of the processing-target substrate.

In accordance with an embodiment of the present invention, there is provided a method of heating a focus ring in a plasma etching apparatus. The plasma etching apparatus includes a vacuum processing chamber; a mounting table for mounting a substrate thereon, the mounting table being provided in the vacuum processing chamber; a gas supply unit for supplying a processing gas to the vacuum processing chamber; and the focus ring provided to surround a periphery of the substrate. The method includes: heating the focus ring by irradiating a heating light from a light source provided outside the vacuum processing chamber to the focus ring through an insulating member provided below the focus ring.

In accordance with another embodiment of the present invention, there is provided a plasma etching apparatus including a vacuum processing chamber; a mounting table for mounting a substrate thereon, the mounting table being provided in the vacuum processing chamber; a gas supply unit for supplying a processing gas to the vacuum processing chamber; a focus ring provided to surround a periphery of the substrate; a light source provided outside the vacuum processing chamber to irradiate a heating light for heating the focus ring; and an insulating member provided below the focus ring. The focus ring is heated by the heating light transmitted from the light source to the focus ring through the insulating member.

In accordance with still another embodiment of the present invention, there is provided a plasma etching apparatus including a vacuum processing chamber; a mounting table for mounting a substrate thereon, the mounting table being provided in the vacuum processing chamber; a gas supply unit for supplying a processing gas to the vacuum processing chamber; a unit for converting the processing gas to a plasma; a focus ring provided to surround a periphery of the substrate; an annular member provided to surround a periphery of the focus ring; a cooling unit for cooling the focus ring; and a heating mechanism for heating the annular member by irradiating a heating light from a light source thereto.

In accordance with still another embodiment of the present invention, there is provided a method of performing a plasma etching on a substrate by using a plasma etching apparatus including a vacuum processing chamber; a mounting table for mounting the substrate thereon, the mounting table being provided in the vacuum processing chamber; a gas supply unit for supplying a processing gas to the vacuum processing chamber; a unit for converting the processing gas to a plasma; a focus ring provided to surround a periphery of the substrate; and an annular member provided to surround a periphery of the focus ring. The method includes providing a heating mechanism for heating the annular member by irradiating a heating light from a light source thereto; and performing the plasma etching on the substrate while heating the annular member by the heating mechanism and cooling the focus ring.

In accordance with the embodiments of the present invention, it is possible to provide a focus ring heating method and a plasma etching apparatus, in which members inside the vacuum chamber can be suppressed from being worn out without a dummy substrate and a structure of the heating mechanism can be simplified to suppress the increase of a manufacturing cost as compared with a conventional method.

In accordance with the embodiments of the present invention, it is also possible to provide a plasma etching apparatus and a plasma etching method, which can suppress the deterioration of a processing shape at a peripheral portion of a processing-target substrate and improve an in-plane uniformity of a plasma etching process by suppressing the increase in an etching rate of a photoresist at the peripheral portion of the processing-target substrate.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
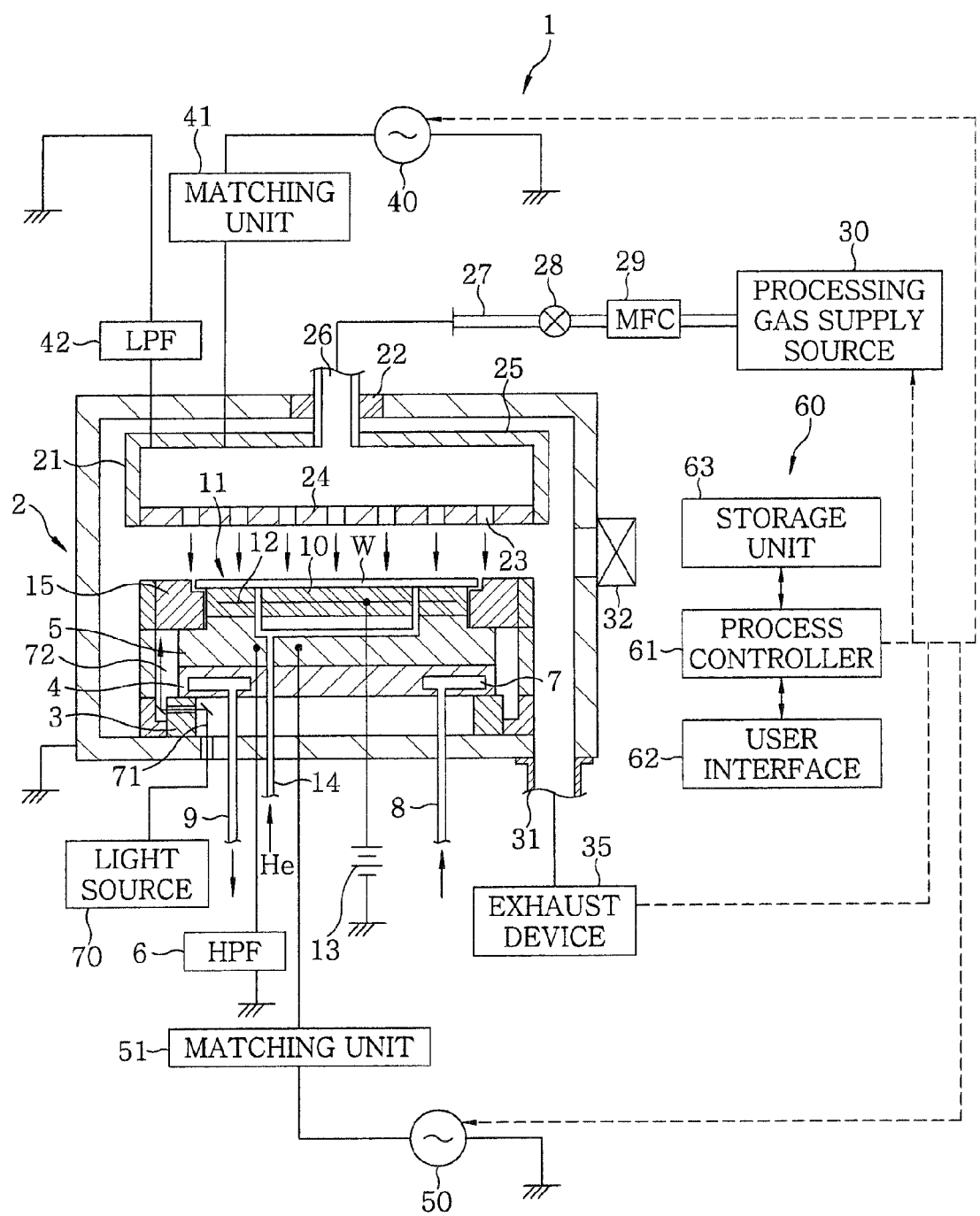
FIG. 1 shows a structure of a plasma etching apparatus in accordance with a first embodiment of the present invention.

Embodiments of the present invention will now be described with reference to the accompanying drawings which form a part hereof. FIG. 1 is a cross sectional view schematically showing a structure of a plasma etching apparatus 1 in accordance with a first embodiment of the present invention. First, the structure of the plasma etching apparatus 1 will be described with reference to FIG. 1.

The plasma etching apparatus 1 is a capacitively coupled parallel plate type etching apparatus in which electrode plates are respectively arranged at an upper and a lower portion to face each other in parallel and connected to a plasma generating power supply.

The plasma etching apparatus 1 includes a cylindrical vacuum processing chamber 2 made of, e.g., aluminum whose surface is anodically oxidized. The vacuum processing chamber 2 is grounded. At a bottom portion in the vacuum processing chamber 2, a substantially cylindrical susceptor support 4 for mounting thereon a target substrate, e.g., a semiconductor wafer W is provided via an insulating base 3 made of, e.g., a ceramic or the like. Further, a susceptor (mounting table) 5 serving as a lower electrode is provided on the susceptor support 4. A high pass filter (HPF) 6 is connected to the susceptor 5.

A coolant path 7 is provided inside the susceptor support 4. A coolant is supplied via a coolant introducing pipe 8 to be circulated in the coolant path 7 and exhausted from a coolant exhaust pipe 9 and a cold heat of the coolant is transferred to the semiconductor wafer W via the susceptor 5. In this way, the temperature of the semiconductor wafer W is controlled to a desired level.

The susceptor 5 is formed into a circular plate shape having a protruded upper central portion. Provided on the susceptor 5 is an electrostatic chuck 11 having a substantially same shape as the semiconductor wafer W. The electrostatic chuck 11 includes therein an electrode 12 interposed between insulating members 10. By applying a DC voltage of, e.g., about 1.5 kV from a DC power supply 13 connected to the electrode 12, the semiconductor wafer W is attracted to and held on the electrostatic chuck 11 by, e.g., a Coulomb force.

A gas channel 14, through which a heat transfer medium (e.g., He gas) is supplied to a backside of the semiconductor wafer W, is formed in the susceptor support 4, the susceptor 5, and the electrostatic chuck 11. Accordingly, a cold heat of the susceptor 5 is transferred to the semiconductor wafer W by the heat transfer medium, to thereby maintain the temperature of the semiconductor wafer W at a predetermined level.

A ring-shaped focus ring 15 is arranged on an upper peripheral portion of the susceptor 5 to surround the semiconductor wafer W mounted on the electrostatic chuck 11. The focus ring 15 is made of, e.g., silicon or the like, to thereby improve an in-plane uniformity of etching.

A ring-shaped insulating member, e.g., a ring-shaped quartz member 72 made of quartz in the present embodiment, is provided below the focus ring 15 to surround the susceptor 5 and the susceptor support 4.

Moreover, a light source 70 is provided at a predetermined portion (atmospheric pressure portion) outside the vacuum processing chamber 2. For example, the light source 70 is provided at a portion under the vacuum processing chamber 2 in the present embodiment. The focus ring 15 is heated by supplying a heating light 71 from the light source 70 to the focus ring 15 through the inside of the ring-shaped quartz member 72. Such a heating mechanism for heating the focus ring 15 will be described later in detail.

Alternatively, the ring-shaped insulating member may be made of a material other than quartz, which allows the heating light 71 to pass therethrough, e.g., fused quartz, sapphire, transparent yttria, or an optical material formed of any one of Ge, ZnSe, ZnS, GaAs, $CaF_2$, $BaF_2$, $MgF_2$, LiF, KBr, KCl, NaCl, and MgO. Further, although the insulating member of the present embodiment has such a ring-shape, the insulating member may have a different shape, e.g., a fan-shape or a cylindrical shape to be described later.

An upper electrode 21 is provided above the susceptor 5 to face the susceptor 5 in parallel. The upper electrode 21 is held at an upper portion of the vacuum processing chamber 2 through an insulating member 22. The upper electrode 21 includes an electrode plate 24, and an electrode holder 25 is made of, e.g., a conductive material for holding the electrode plate 24. The electrode plate 24 is made of, e.g., a conductor or a semiconductor and has a plurality of injection holes 23. The electrode plate 24 faces the susceptor 5.

In the upper electrode 21, a gas inlet port 26 is provided at a central portion of the electrode holder 25 and a gas supply pipe 27 is connected to the gas inlet port 26. A processing gas supply source 30 is connected to the gas supply pipe 27 via a valve 28 and a mass flow controller (MFC) 29. A processing gas for plasma etching is supplied from the processing gas supply source 30.

An exhaust pipe 31 is connected to a bottom portion of the vacuum processing chamber 2 and an exhaust device 35 is connected to the exhaust pipe 31. The exhaust device 35 includes a vacuum pump such as a turbo molecular pump or the like to exhaust the inside of the chamber 2 to be depressurized to a vacuum level, e.g., about 1 Pa or less. Moreover, a gate valve 32 is provided in a sidewall of the vacuum processing chamber 2. While the gate valve 32 is opened, the semiconductor wafer W is transferred between the vacuum processing chamber 2 and an adjacent load-lock chamber (not shown).

A first high frequency power supply 40 is connected to the upper electrode 21 via a matching unit 41 by using a power supply wire. Moreover, a low pass filter (LPF) 42 is connected to the upper electrode 21. A high frequency power of, e.g., about 50 to 150 MHz is supplied from the first high frequency power supply 40. As such, by supplying a high frequency power of a relatively high frequency, it is possible to generate a high density plasma in a desired dissociation state.

A second high frequency power supply 50 is connected to the susceptor 5 serving as the lower electrode via a matching unit 51 by using a power supply wire. A second high frequency power supplied from the second high frequency power supply 50 is lower than that supplied from the first high frequency power supply 40. By supplying the high frequency power of, e.g., about 20 MHz or less from the second high frequency power supply 50, it is possible to apply an adequate ion action to the semiconductor wafer W as the processing-target substrate without damaging it.

An operation of the plasma etching apparatus 1 is generally controlled by a control unit 60. The control unit 60 includes a process controller having a central processing unit (CPU) to control various components of the plasma etching apparatus 1; a user interface 62; and a storage unit 63.

The user interface 62 includes a keyboard through which an operator inputs a command or the like to operate or manage the plasma etching apparatus 1, a display unit through which an operation status of the plasma etching apparatus 1 is visually displayed, and the like.

The storage unit 63 stores control programs (software) for performing various processes of the plasma etching apparatus 1 under the control of the process controller 61; and recipes having processing condition data and the like. As necessary, a desired process of the plasma etching apparatus is performed under the control of the process controller 61 by reading from the storage unit 63 a recipe corresponding to a command or the like inputted through the user interface 62 to be executed by the process controller 61.

The control program and the recipes having processing condition data and the like may be stored in a computer-readable storage medium. The storage medium and the recipes may be, e.g., a hard disk, a CD, a flexible disk, a semiconductor memory, or the like. Alternatively, the control program and the recipes may be adequately transmitted on-line from another apparatus through, e.g., a dedicated line.

When the plasma etching is performed on the semiconductor wafer W in the plasma etching apparatus 1, the gate valve 32 is first opened and the semiconductor wafer W is loaded from a load-lock chamber (not shown) into the vacuum processing chamber 2 to be mounted on the electrostatic chuck 11. Then, by applying a DC voltage from the DC power supply 13, the semiconductor wafer W is attracted to and held on the electrostatic chuck 11. Successively, the gate valve 32 is closed and the vacuum processing chamber 2 is exhausted to a preset vacuum level by the exhaust device 35.

Thereafter, the valve 28 is opened and a processing gas is supplied from the processing gas supply source 30 to a hollow portion of the upper electrode 21 via the gas supply pipe 27 and the gas inlet port 26, while the flow rate of the processing gas is being adjusted by the mass flow controller 29. Then, the processing gas is injected through the injection holes 23 of the electrode plate 24 uniformly over the semiconductor wafer W as pointed by arrows illustrated in FIG. 1.

The pressure inside the vacuum processing chamber 2 is maintained at a preset level. Then, by supplying a high frequency power of a preset frequency from the first high frequency power supply 40 to the upper electrode 21, a high frequency electric field is generated between the upper electrode 21 and the susceptor 5 serving as the lower electrode, so that the processing gas is decomposed to be converted to a plasma.

In the meantime, a high frequency power having a lower frequency than that of the high frequency power supplied from the first high frequency power 40 is supplied from the second high frequency power 50 to the susceptor 5 serving as the lower electrode. Accordingly, the ions in the plasma are attracted to the susceptor 5, to thereby improve an etching anisotropy by ion assist.

Next, if the plasma etching process is completed, the supplies of the high frequency power and the processing gas are stopped and the semiconductor wafer W is unloaded from the vacuum processing chamber 2 in reverse order.

Figure 2A:
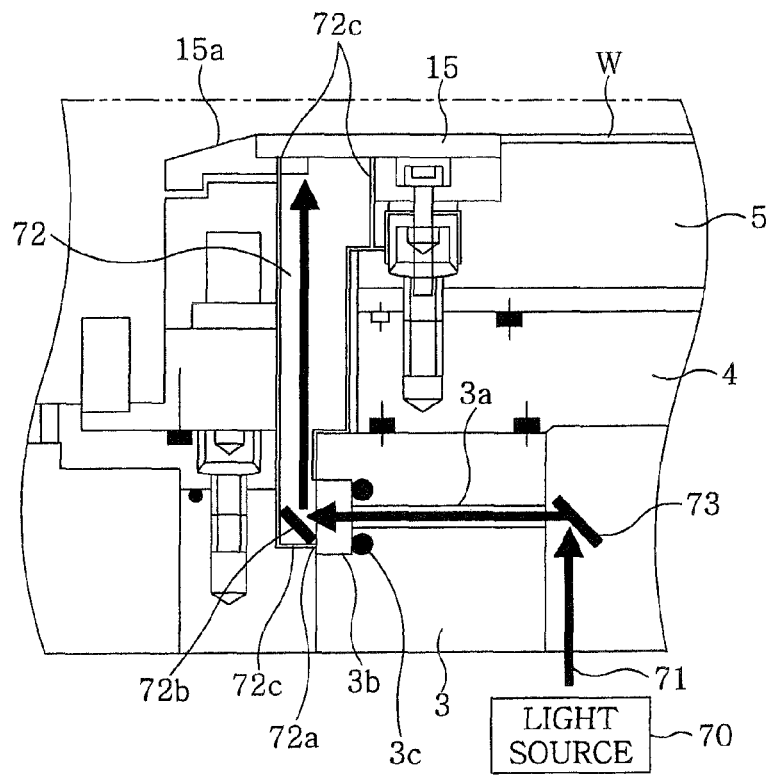
FIGS. 2A and 2B are partially enlarged views showing main parts of the plasma etching apparatus shown in FIG. 1.
Figure 2B:
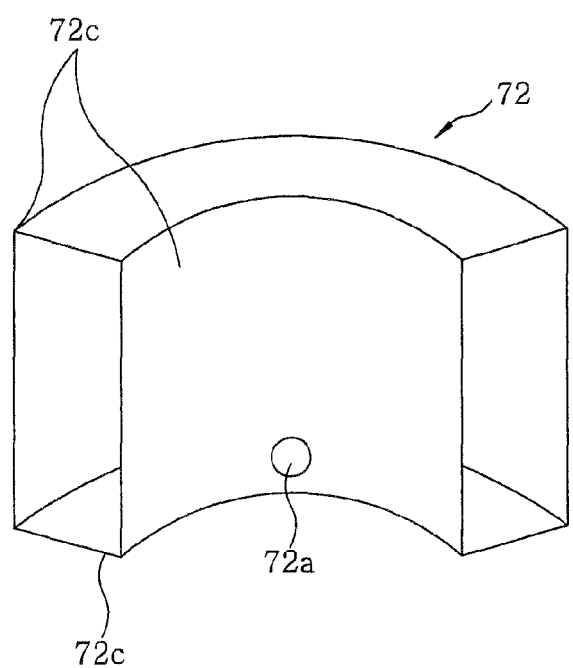

FIG. 2A is an enlarged cross sectional view showing the focus ring 15 of the plasma etching apparatus 1 shown in FIG. 1 and components for heating the focus ring 15, and FIG. 2B three-dimensionally shows a part of the ring-shaped quartz member 72. As shown in FIGS. 2A and 2B, the focus ring 15 is mounted on the ring-shaped quartz member 72 and the susceptor 5 serving as a lower electrode to surround a periphery of the semiconductor wafer W. The ring-shaped quartz member 72 surrounds a periphery of the susceptor (lower electrode) 5 to insulate the susceptor 5 from therearound.

Formed in the base 3 is an optical path 3a through which the heating light 71 from the light source 70 travels. A window 3b for airtight sealing is provided at an end portion of an outlet side (left side in FIG. 2A) of the optical path 3a. The heating light 71 from the light source 70 is reflected at about 90° by a mirror or prism 73 provided near an inlet of the optical path 3a to be introduced in the optical path 3a. The reference numeral "3c" denotes an O-ring for airtightly sealing the window 3b in FIG. 2.

As shown in FIG. 2B, a light introducing part 72a is provided at a portion of the ring-shaped quartz member 72 to correspond to the window 3b. The ring-shaped quartz member 72 includes a reflection portion 72b provided inwards of the light introducing part 72a, so that the heating light 71 introduced through the light introducing part 72a is upwardly reflected by the reflection portion 72b. Then, the heating light 71 travels to the focus ring 15.

A reflection film 72c is provided on an inner surface, an outer surface, and a bottom surface of the ring-shaped quartz member 72 except for the light introducing part 72a. The reflection film 72c serves to suppress the heating light 71 introduced in the ring-shaped quartz member 72 through the light introducing part 72a from leaking from the inner surface, the outer surface, or the bottom surface to the outside.

Figure 5:
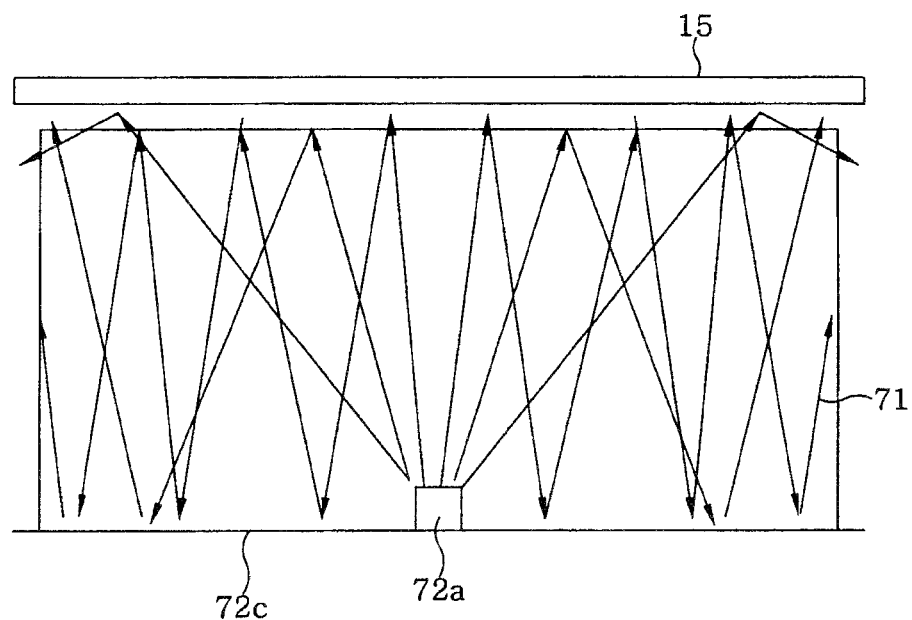
FIG. 5 shows how a heating light is propagated.

As shown in FIG. 5, by the reflection film 72c, the heating light 71 introduced in the ring-shaped quartz member 72 is diffusely reflected and divided in the ring-shaped quartz member 72 to be scanned, thereby being dispersed and transferred to every area of the focus ring 15 to uniformly efficiently heat the focus ring 15.

The reflection film 72c can be formed by using a metal film or a dielectric film. Alternatively, instead of forming the reflection film 72c, a surface of the ring-shaped quartz member 72 may be made transparent or subjected to a fire-polish process, in order to enable the heating light 71 traveling in the ring-shaped quartz member 72 to be easily reflected.

As the light source 70, it is preferable to employ a laser beam source generating a laser beam or a light emitting diode (LED) light source having LEDs. Moreover, in the present embodiment, it is preferable to use a beam of light that does not penetrate through the focus ring 15 (silicon material) as the heating light 71 irradiated from the light source 70. In this case, the heating light 71 irradiated from the light source 70 preferably has a wavelength that is equal to or smaller than a fundamental absorption edge of silicon (a wavelength of 1050 nm or less). In this way, the focus ring 15 can be efficiently heated. As the heating light 71, any one of ultraviolet, visible, and infrared beams may be employed.

Meanwhile, as shown in FIGS. 2A and 2B, a ring-shaped cover ring 15a is provided at a peripheral portion of the focus ring 15. The cover ring 15a may be heated in the same way as that of the focus ring 15.

Figure 3:
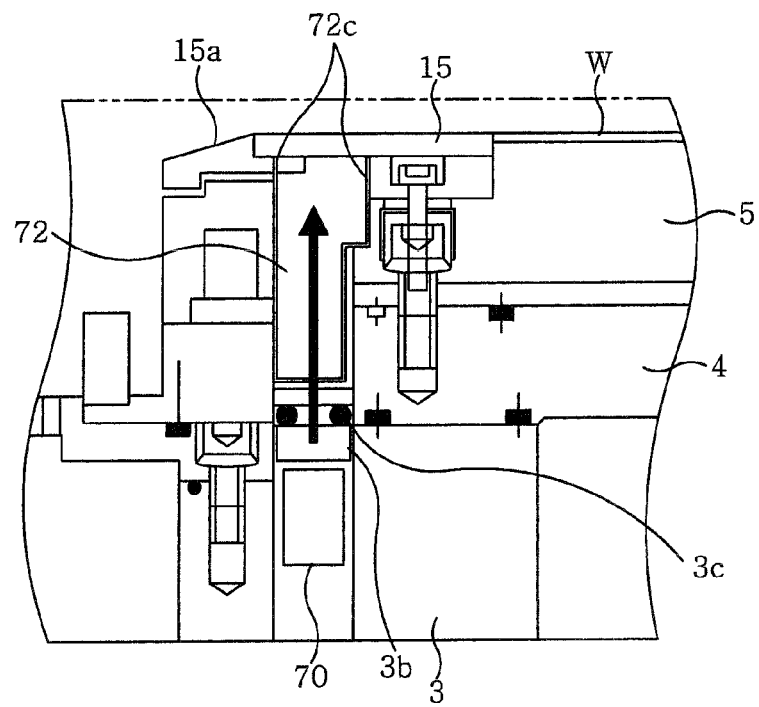
FIG. 3 shows main parts of a plasma etching apparatus in accordance with another embodiment of the present invention.
Figure 4:
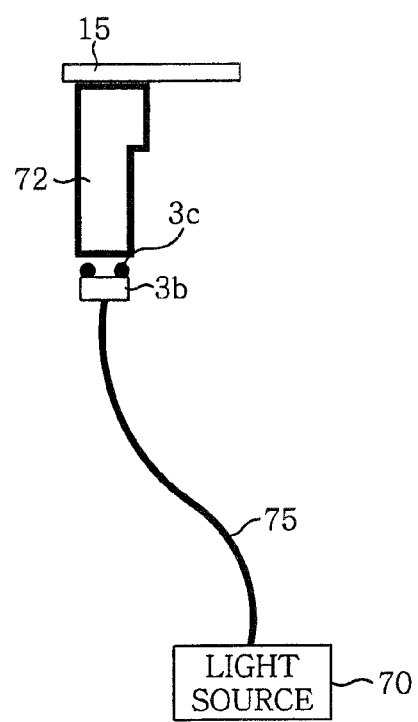
FIG. 4 shows main parts of a plasma etching apparatus in accordance with still another embodiment of the present invention.

As for a structure for introducing the heating light 71 into the ring-shaped quartz member 72, for example, as shown in FIG. 3, the light source 70 having a plurality of LEDs may be provided below the quartz member 72, to directly introduce the heating light 71 from the light source 70 into the quartz member 72 through the window 3b. Alternatively, as shown in FIG. 4, the heating light 71 may be introduced from the light source 70 into a plurality of optical fibers 75 while leading ends of the optical fibers 75 are arranged below the quartz member 72, to introduce the heating light 71 from the optical fibers 75 into the lower portion of the quartz member 72 through the window 3b.

Figure 6:
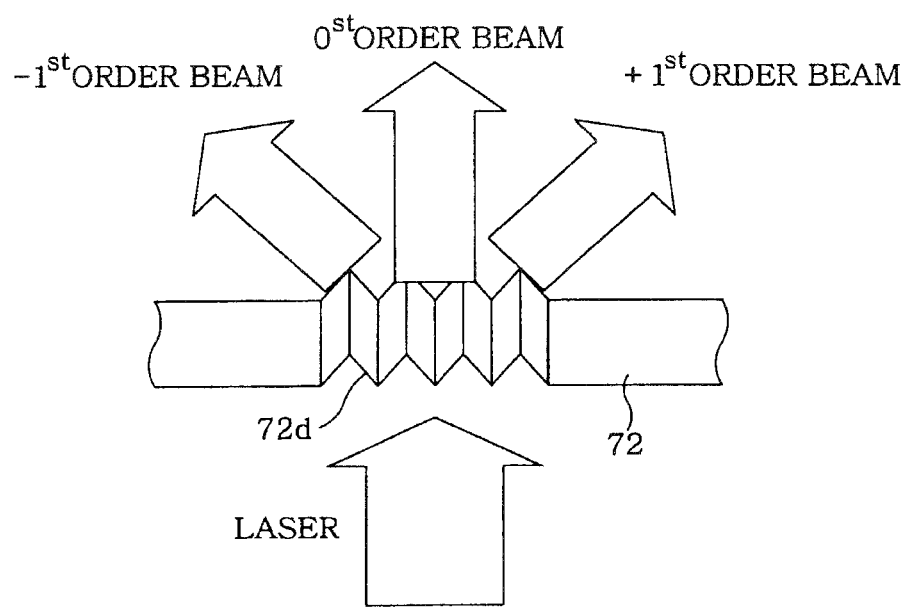
FIG. 6 shows main parts of a plasma etching apparatus in accordance with still another embodiment of the present invention.

As shown in FIG. 6, a diffusion unit 72d having a diffraction grating may be provided in the light introducing part 72a and a light output part to dividedly disperse the heating light 71 introduced in the ring-shaped quartz member 72 into a $-1^{st}$, a $0^{th}$, a $+1^{st}$ order light, and the like. In this case, the dispersion state (diffraction angle) may be changed by adjusting the wavelength of the heating light 71 irradiated from the light source 70, thereby more uniformly dispersing the light 71 and uniformly heating the focus ring 15.

Figure 7:
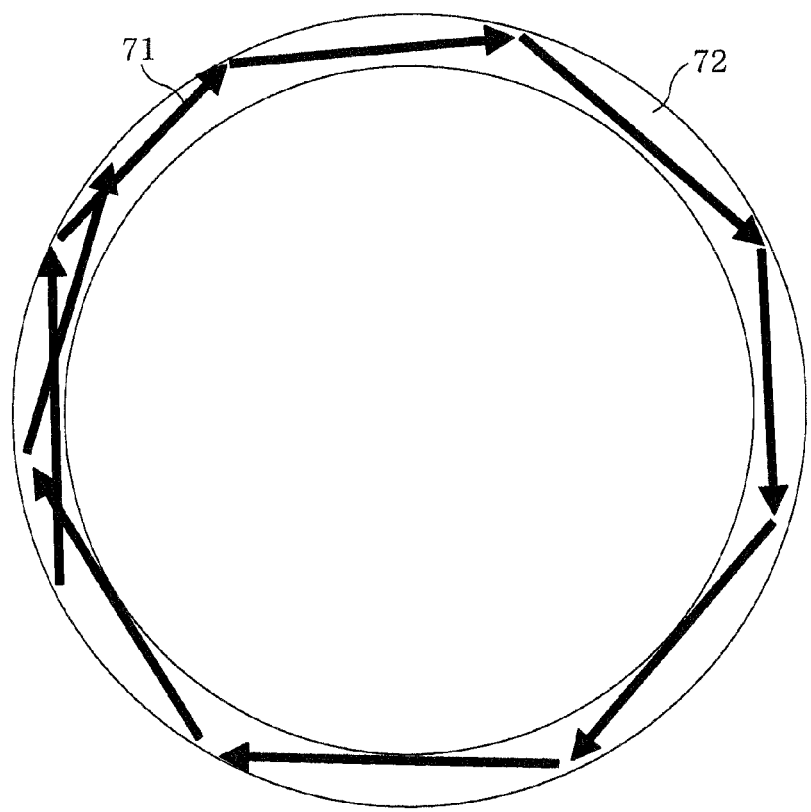
FIG. 7 shows main parts of a plasma etching apparatus in accordance with still another embodiment of the present invention.
Figure 8:
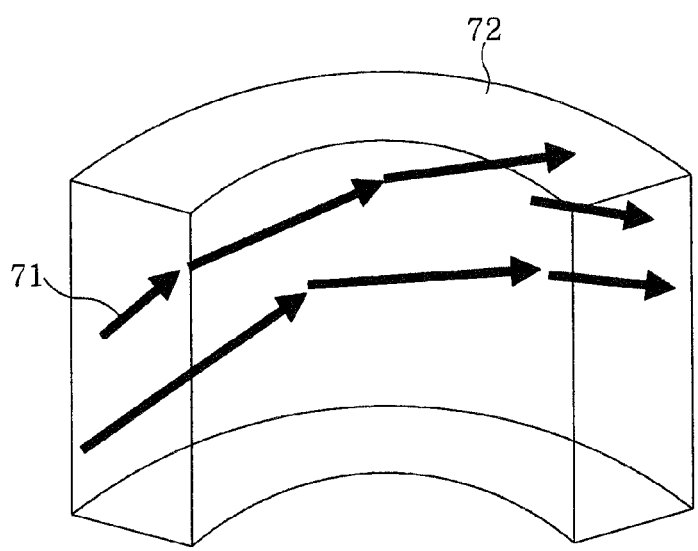
FIG. 8 shows main parts of a plasma etching apparatus in accordance with still another embodiment of the present invention.

Instead of forming the reflection film 72c in the ring-shaped quartz member 72, the inner surface, the outer surface, and the bottom surface of the ring-shaped quartz member 72 may be polished into a mirror surface. In this case, the heating light 71 is introduced into the ring-shaped quartz member 72 under an incident condition (incident angle) that the heating light 71 is totally reflected on the inner surface of the ring-shaped quartz member 72 as shown in FIGS. 7 and 8.

Figure 9:
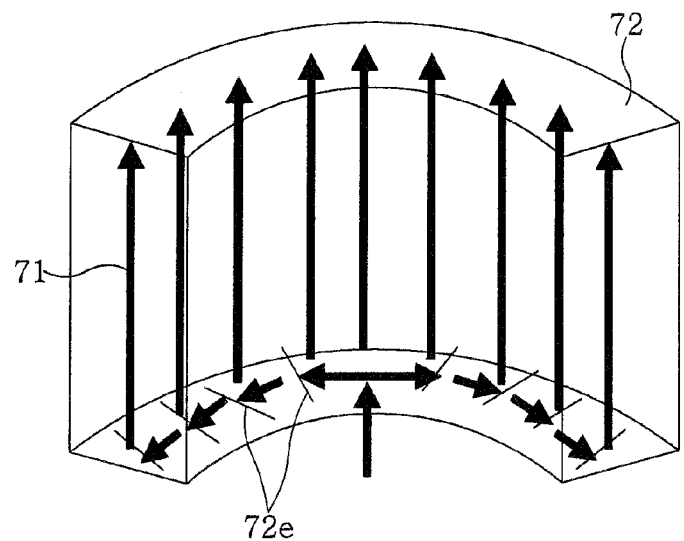
FIG. 9 shows main parts of a plasma etching apparatus in accordance with still another embodiment of the present invention.
Figure 10:
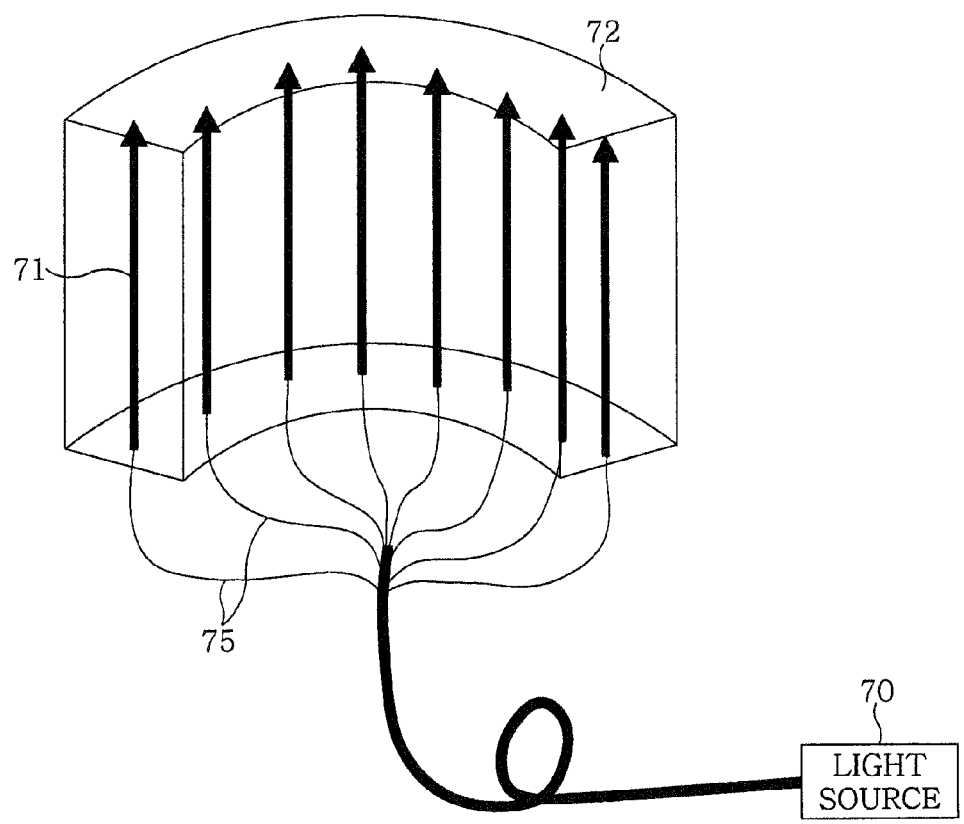
FIG. 10 shows main parts of a plasma etching apparatus in accordance with still another embodiment of the present invention.

Alternatively, as shown in FIG. 9, a plurality of beam splitters 72e may be provided inside the ring-shaped quartz member 72 to disperse little by little the introduced heating light 71 in a circumferential direction such that the dispersed heating light 71 travels upwardly (toward the focus ring 15). Further alternatively, as shown in FIG. 10, the heating light 71 irradiated from the light source 70 may be dispersed by the optical fibers 75 to be introduced through a plurality of locations into the ring-shaped quartz member 72.

In the present embodiment, the heating light 71 dispersed from the ring-shaped quartz member 72 is supplied to the focus ring 15. However, the heating light 71 may be propagated and totally reflected inside the focus ring 15 as shown in FIGS. 11A to 12C for example. In this case, it is necessary to use a light having a wavelength that is longer than the fundamental absorption edge of silicon (1050 nm) as the heating light 71 such that the heating light 71 is propagated inside the focus ring 15.

Figure 11A:
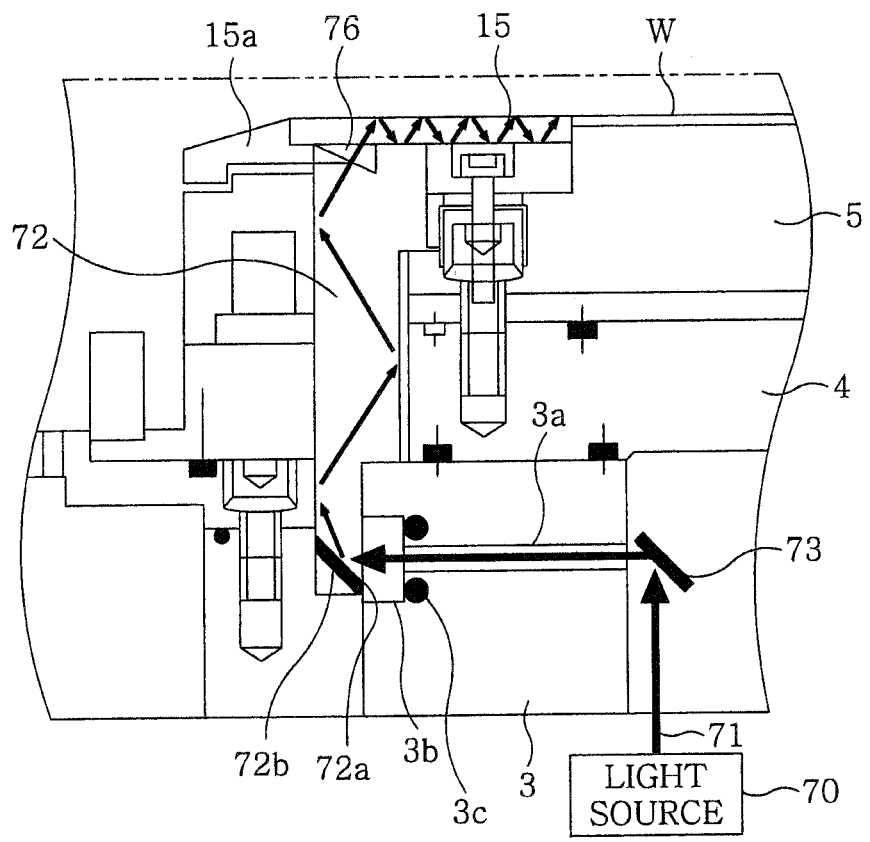
FIGS. 11A to 11C show main parts of a plasma etching apparatus in accordance with still another embodiment of the present invention.
Figure 11B:
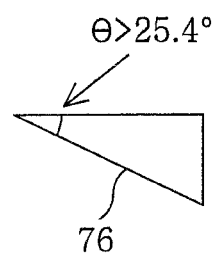
Figure 11C:
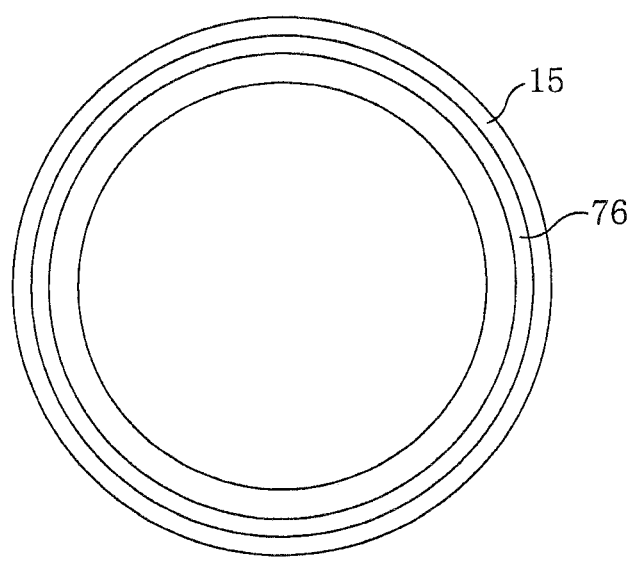

As shown in FIGS. 11A to 11C, a ring-shaped prism 76 made of a silicon material is provided between the ring-shaped quartz member 72 and the focus ring 15. FIG. 11A is a cross sectional view showing main parts of the plasma etching apparatus 1. FIG. 11B is a cross sectional view showing the prism 76. FIG. 11C is a plan view showing the focus ring 15 and the prism 76.

As shown in FIG. 11B, an angle between an incident surface and a horizontal surface of the prism 76 is greater than 25.4° and, thus, the heating light 71 introduced in the focus ring 15 through the prism 76 is propagated while being totally reflected inside the focus ring 15 in a circumferential direction thereof. The angle of 25.4° is obtained by setting refractive indexes of silicon and quartz as 3.5 and 1.5, respectively.

Figure 12A:
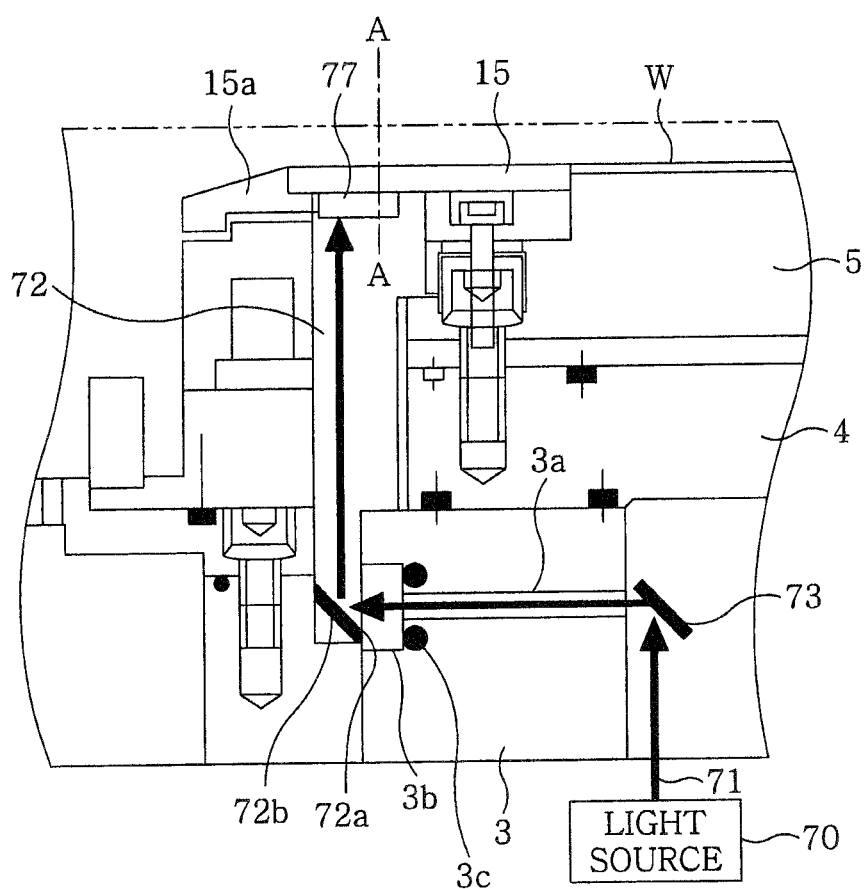
FIGS. 12A to 12C show main parts of a plasma etching apparatus in accordance with still another embodiment of the present invention.
Figure 12B:
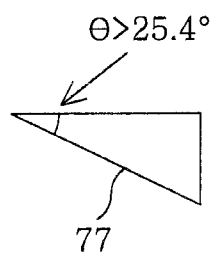
Figure 12C:
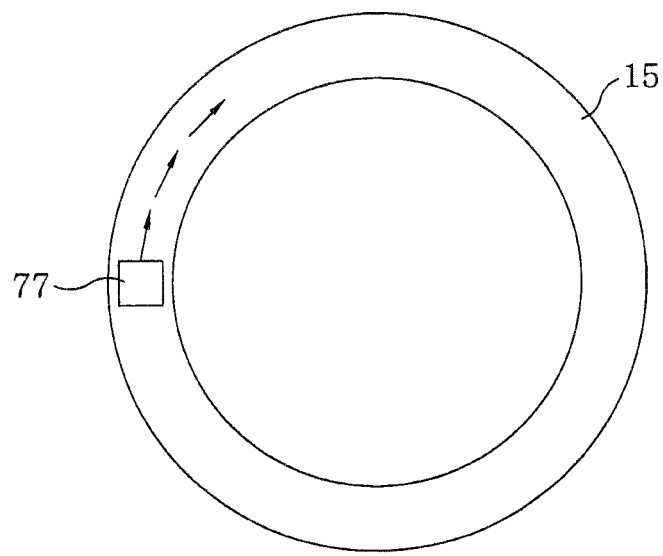

As shown in FIGS. 12A to 12C, a rectangular prism 77 made of a silicon material is provided between the ring-shaped quartz member 72 and the focus ring 15. FIG. 12A is a cross sectional view showing main parts of the plasma etching apparatus 1. FIG. 12B is a cross sectional view showing the prism 77 taken along a dotted line A-A shown in FIG. 12A. FIG. 12C is a plan view showing the focus ring 15 and the prism 77.

By the prism 77, the heating light 71 is refracted in a circumferential direction of the focus ring 15. In the cross section of the prism 77 taken along the dotted line A-A, an angle between an incident surface and a horizontal surface thereof is greater than 25.4°. Accordingly, the heating light 71 introduced in the focus ring 15 through the prism 77 is propagated while being totally reflected in the circumferential direction inside the focus ring 15. As described above, the angle of 25.4° is obtained by setting refractive indexes of silicon and quartz as 3.5 and 1.5, respectively.

Instead of providing the prism 76 or 77, a process for changing an optical path may be performed on the surface of at least one of the ring-shaped quartz member 72 and the focus ring 15 to serve as a prism.

In the case that the plasma etching apparatus 1 performs the plasma etching on the semiconductor wafer W, when a plasma is generated inside the vacuum processing chamber 2, the focus ring 15 is exposed to the plasma. For that reason, as the plasma etching is performed on the semiconductor wafer W, the focus ring 15 having a room temperature at first is heated by the plasma to a high temperature.

Moreover, when a plurality of semiconductor wafers is successively subjected to the plasma etching, the focus ring 15 has the room temperature before the plasma etching process is performed on the first semiconductor wafer W. However, the focus ring 15 is heated as the plasma etching process is performed on the first semiconductor wafer W, thereby gradually increasing the temperature of the focus ring 15.

After the plasma etching process of the first semiconductor wafer W is completed, the first semiconductor wafer W is unloaded from the vacuum processing chamber 2. The focus ring 15 is cooled to some extent until the second semiconductor wafer W is loaded in the vacuum processing chamber 2 and subjected to the plasma etching process.

Thereafter, the focus ring 15 is heated again as the plasma etching process is started to be performed on the second semiconductor wafer W. As the focus ring 15 is repeatedly heated and cooled, the temperature of the focus ring 15 has a constant range.

As described above, the temperature of the focus ring 15 is changed depending on the start of the plasma etching process. Accordingly, especially, a processed state of the first semiconductor wafer W may become different from those of the second and following semiconductor wafers W subjected to the plasma etching due to the difference in the temperature of the focus ring 15 without dealing with such change of temperature.

For that reason, a plasma is conventionally generated in the vacuum processing chamber 2 while a dummy wafer is mounted on the susceptor 5 and the focus ring 15 is heated by the plasma before the processing of the semiconductor wafer W is started. If a plasma is generated in the vacuum processing chamber 2 while no dummy wafer is mounted on the susceptor 5, the surface of the electrostatic chuck 11 provided on the susceptor 5 may be damaged by the plasma. Accordingly, the dummy wafer is used in the conventional method.

However, if the focus ring 15 is heated in this way, the focus ring 15 and other members included in the vacuum processing chamber 2 are exposed to the plasma, thereby being worn out. Further, if the focus ring 15 is heated as described above, it becomes necessary to manage a frequency of using the dummy wafer or the like and provide an accommodation part (slot) for accommodating the dummy wafer.

In the present embodiment, for example, before the processing of the first semiconductor wafer W is started, the heating light 71 is irradiated from the light source 70 to the focus ring 15 through the ring-shaped quartz member 72, to thereby heat the focus ring 15. After the focus ring 15 is heated in this way, the processing on semiconductor wafer W is started.

As described above, in accordance with the present embodiment, it is not necessary to employ the dummy wafer since the focus ring 15 is heated under the condition that no plasma is generated. Further, when the focus ring 15 is heated, the focus ring 15 and other members included in the vacuum processing chamber 2 are not worn out due to no exposure to plasma. Here, the focus ring 15 may be heated regardless of whether or not a semiconductor wafer W is mounted on the susceptor 5.

In addition, for example, when a little heat is transferred from the plasma and it is necessary to increase the temperature of the focus ring 15 during the plasma etching, the focus ring 15 may be heated by irradiating the heating light 71 thereto during the plasma etching.

Further, since the temperature of the focus ring 15 during the plasma etching is changed depending on the plasma etching time, it is possible to control the temperature of the focus ring 15 to be uniform by irradiating the heating light 71 to heat the focus ring 15 while measuring the temperature of the focus ring 15 with a thermometer. In this case, the temperature of the focus ring 15 may be measured by the temperature measuring technique using a low coherence interferometer. Here, a light irradiated from the light source 70 may be also used for temperature measurement.

As such, since the focus ring 15 is heated in advance without a dummy wafer in the present embodiment, it is possible to simplify the plasma etching process as compared with the conventional method. Further, since the focus ring 15 is heated without a plasma, it is possible to prevent the focus ring 15 and other components from being worn out by the plasma. In addition, since the temperature of the focus ring 15 is increased to a desired value in advance, it is possible to uniformly perform the plasma etching process on each semiconductor wafer W.

Moreover, in the present embodiment, the heating light 71 is irradiated from the light source 70 provided outerside of the vacuum processing chamber 2 to the focus ring 15 through the ring-shaped quartz member 72 provided below the focus ring 15. Accordingly, it is possible to simplify the structure of the heating mechanism, thereby suppressing the increase of the manufacturing cost as compared with the case of requiring an inductive heating unit inside the focus ring 15 and an induction coil inside the vacuum processing chamber 2, for example.

Figure 13:
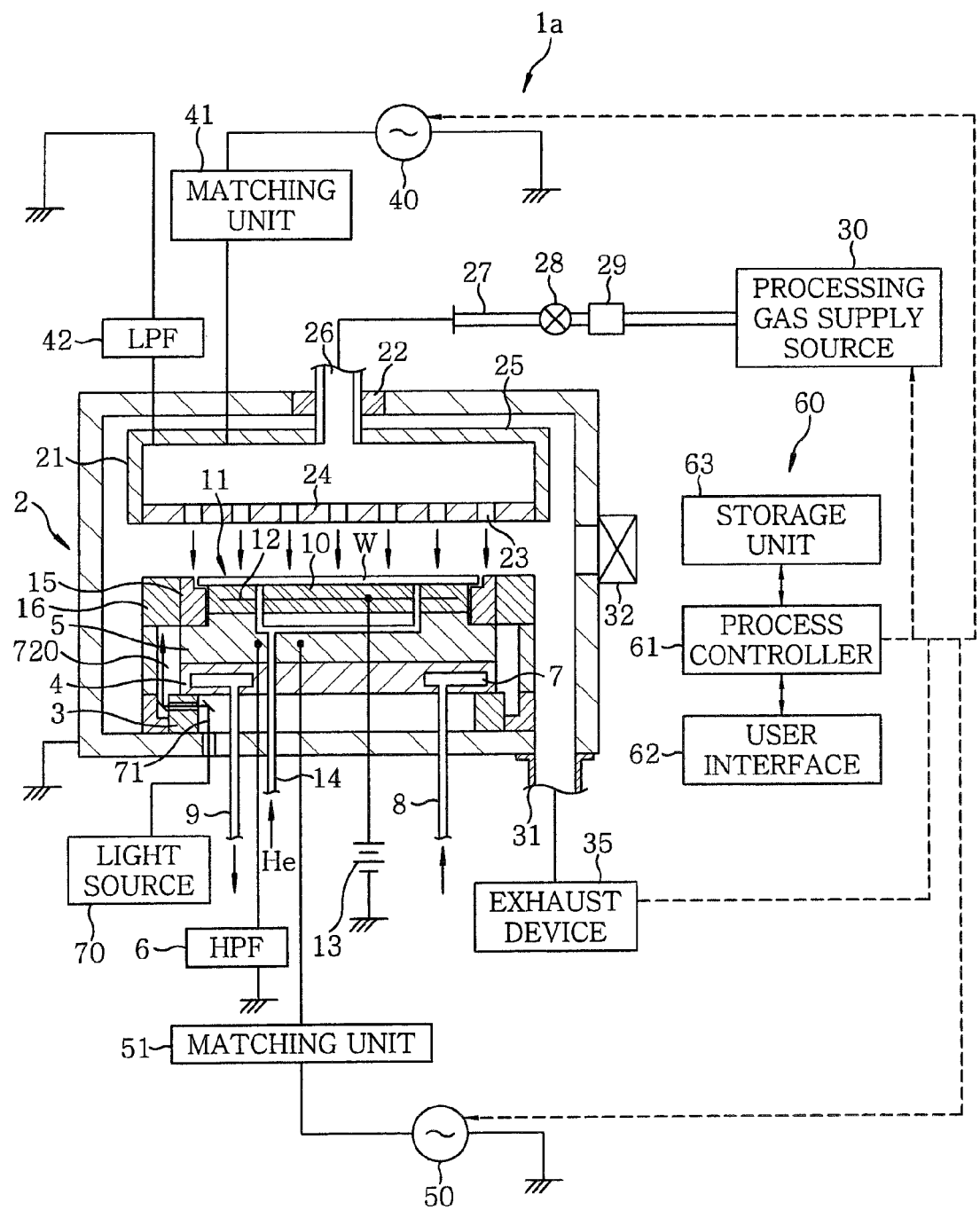
FIG. 13 shows a structure of a plasma etching apparatus in accordance with a second embodiment of the present invention.

FIG. 13 is a cross sectional view schematically showing a structure of a plasma etching apparatus 1a in accordance with a second embodiment of the present invention.

The plasma etching apparatus 1a is a capacitively coupled parallel plate type etching apparatus in which electrode plates are respectively arranged at an upper and a lower portion to face each other in parallel and connected to a plasma generating power supply. Same reference numerals are given to components corresponding to those of the plasma etching apparatus 1 shown in FIG. 1 and the redundant description thereof will be omitted herein.

In the plasma etching apparatus 1a of the present embodiment, the ring-shaped focus ring 15 is arranged on an upper peripheral portion of the susceptor 5 to surround the semiconductor wafer W mounted on the electrostatic chuck 11. The focus ring 15 is made of, e.g., silicon, SiC or the like and serves to improve an in-plane uniformity of etching.

An annular member (cover ring) 16 is provided at a peripheral portion of the focus ring 15 to surround a periphery of the focus ring 15. The annular member 16 is partially or entirely made of, e.g., silicon, SiC or the like.

Figure 14:
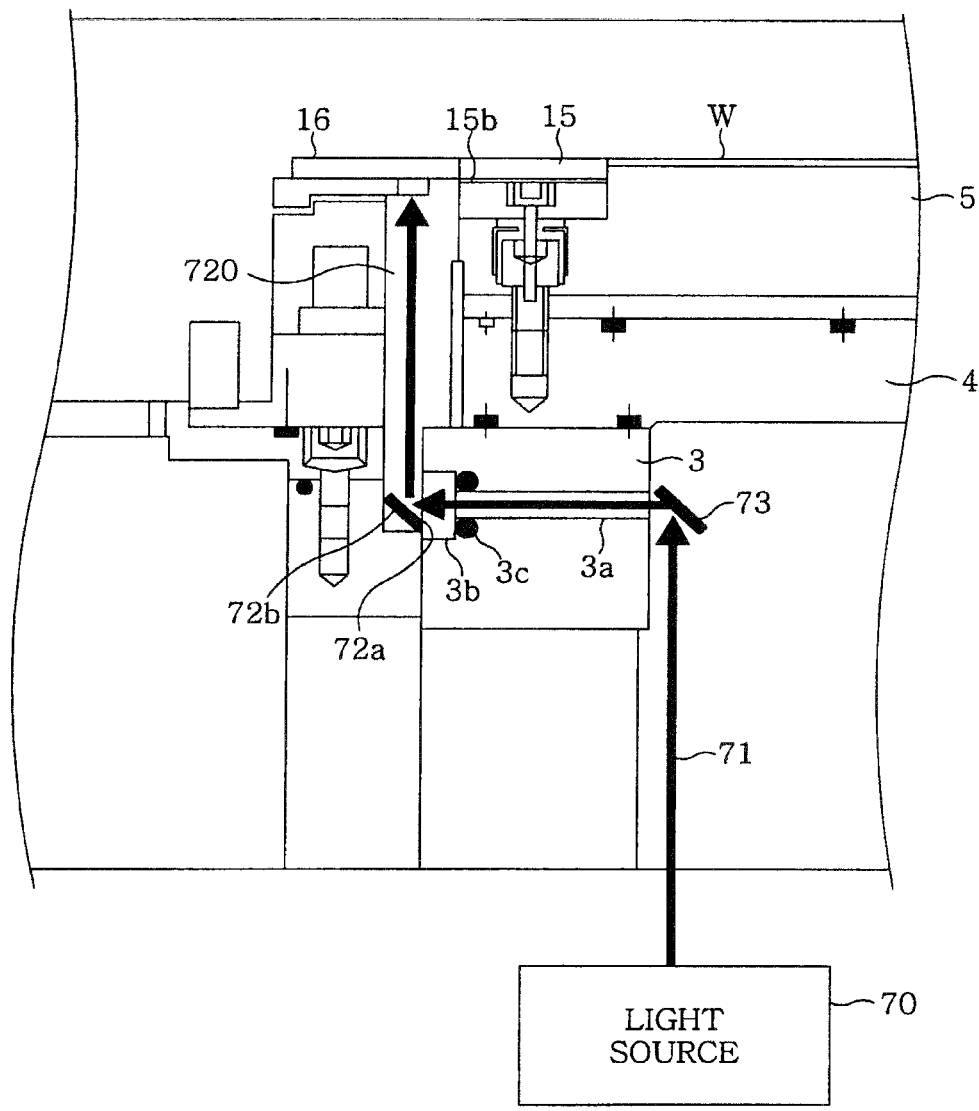
FIG. 14 partially shows main parts of the plasma etching apparatus shown in FIG. 13.

As shown in FIG. 14, a ring-shaped insulating member, e.g., a ring-shaped quartz member 720 made of quartz in the present embodiment, is provided below the annular member 16 to surround the susceptor 5 and the susceptor support 4. Alternatively, the ring-shaped quartz member 720 may be made of a material other than quartz, which allows the heating light 71 to pass therethrough, e.g., fused quartz, sapphire, transparent yttria, or an optical material formed of one of Ge, ZnSe, ZnS, GaAs, $CaF_2$, $BaF_2$, $MgF_2$, LiF, KBr, KCl. NaCl, and MgO. Further, the quartz member 720 may have a different shape other than the ring shape, e.g., a fan-shape or a cylindrical shape to be described later.

The light source 70 for the heating is provided at a predetermined portion (atmospheric pressure portion) outside the vacuum processing chamber 2 (under the vacuum processing chamber 2 in the present embodiment). The annular member 16 is heated by supplying the heating light 71 from the light source 70 to the annular member 16 through the ring-shaped quartz member 720.

FIG. 14 is an enlarged cross sectional view showing the annular member 16 of the plasma etching apparatus 1a shown in FIG. 13 and components for heating the annular member 16. As shown in FIG. 14, the focus ring 15 is mounted on the susceptor 5 serving as a lower electrode to surround a periphery of the semiconductor wafer W. The annular member 16 is provided, to surround a periphery of the focus ring 15, on the ring-shaped quartz member 720 that is provided to surround the susceptor 5 and the susceptor support 4. The ring-shaped quartz member 720 surrounds a periphery of the susceptor (lower electrode) 5 to insulate the susceptor 5 from therearound.

Formed in the base 3 is the optical path 3a through which the heating light 71 from the light source 70 travels. The window 3b for airtight sealing is provided at an end portion of an outlet side (left side in FIG. 14) of the optical path 3a. The heating light 71 irradiated from the light source 70 is reflected at about 90° by the mirror or prism 73 provided near an inlet of the optical path 3a to be introduced in the optical path 3a. The reference numeral "3c" denotes an O-ring for airtightly sealing the window 3b in FIG. 14.

The light introducing part 72a is provided at a portion of the ring-shaped quartz member 720 to correspond to the window 3b. The ring-shaped quartz member 720 includes the reflection portion 72b provided inwards of the light introducing portion 72a, so that the heating light 71 introduced through the light introducing part 72a is upwardly reflected by the reflection portion 72b. Then, the heating light 71 travels to the annular member 16.

Figure 15:
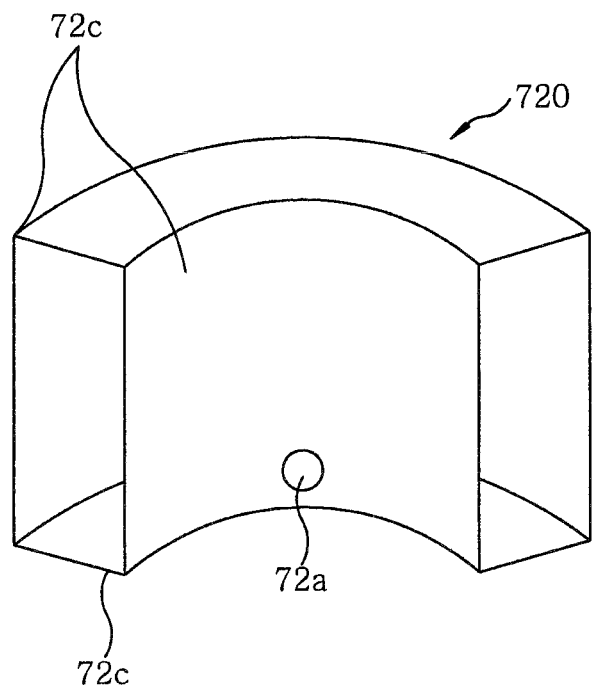
FIG. 15 partially shows main parts of the plasma etching apparatus shown in FIG. 13.

As shown in FIG. 15, the reflection film 72c serving a reflection unit is provided on an inner surface, an outer surface, and a bottom surface of the ring-shaped quartz member 720 except for the light introducing part 72a. The reflection film 72c serves to suppress the heating light 71 introduced in the ring-shaped quartz member 720 through the light introducing part 72a from leaking from the inner surface, the outer surface, or the bottom surface to the outside.

Figure 16:
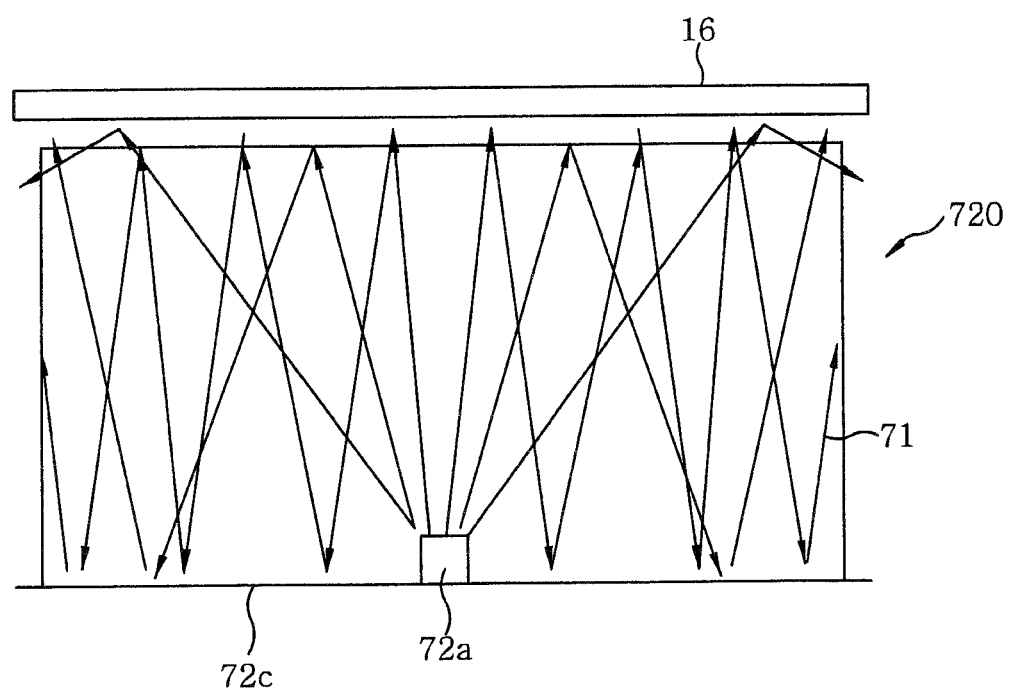
FIG. 16 shows how a heating light is propagated.

As shown in FIG. 16, by the reflection film 72c, the heating light 71 introduced in the ring-shaped quartz member 720 is diffusely reflected and divided in the ring-shaped quartz member 720 to be scanned, thereby being dispersed and transferred to every area of the annular member 16 to uniformly efficiently heat the annular member 16. The reflection film 72c can be formed by using a metal film or a dielectric film.

As the light source 70 for the heating, it is preferable to employ a laser beam source generating a laser beam or a light emitting diode (LED) light source having LEDs. Moreover, in the present embodiment, it is preferable to use a light that does not pass through the annular member 16 (silicon material) as the heating light 71 irradiated from the light source 70. In this case, the heating light 71 irradiated from the light source 70 preferably has a wavelength that is equal to or smaller than a fundamental absorption edge of silicon (a wavelength of 1050 nm or less). In this way, the annular member 16 can be efficiently heated. As the heating light 71, any one of ultraviolet, visible, and infrared beams may be employed.

Meanwhile, as shown in FIG. 14, the focus ring 15 is provided at the inner side of the annular member 16 and, also, on the susceptor 5 through a heat transfer sheet 15b. The susceptor 5, as described above, is cooled by a coolant to cool the semiconductor wafer W. Accordingly, the focus ring 15 is cooled by a cold heat transferred from the susceptor 5. In the present embodiment, the temperature of the focus ring 15 is maintained to be lower than 200° C. when a plasma etching is performed on a film formed on the semiconductor wafer W by using a plasma generated in the processing chamber 2.

As described above, in the present embodiment, the plasma etching is performed while the annular member (cover ring) 16 is heated by irradiating the heating light 71 from the light source 70 thereto such that the temperature of the annular member 16 is maintained to be equal to or higher than 200° C. (e.g., 300 to 500° C.) and the focus ring 15 is cooled such that the temperature of the focus ring 15 is maintained to be lower than 200° C. Accordingly, it is possible to suppress both the deterioration of a processing shape, such as the decrease in diameter of a hole at the peripheral portion of the semiconductor wafer W and the increase in etching rate of a photoresist at the peripheral portion of the semiconductor wafer W. As a result, the selectivity can be suppressed from being lowered, thereby improving the in-plane uniformity of the plasma etching process.

Figure 17:
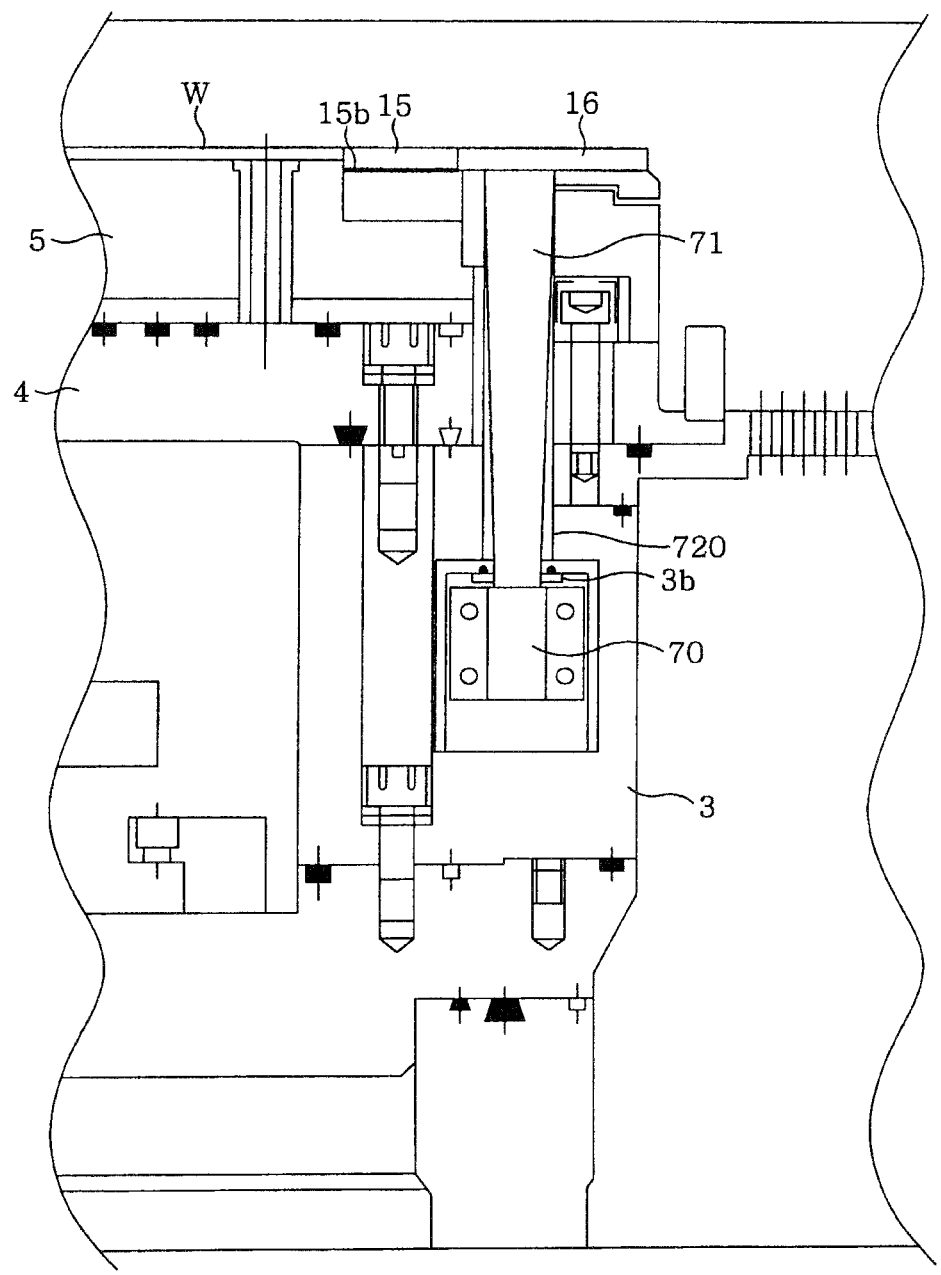
FIG. 17 shows main parts of a plasma etching apparatus in accordance with another embodiment of the present invention.
Figure 18:
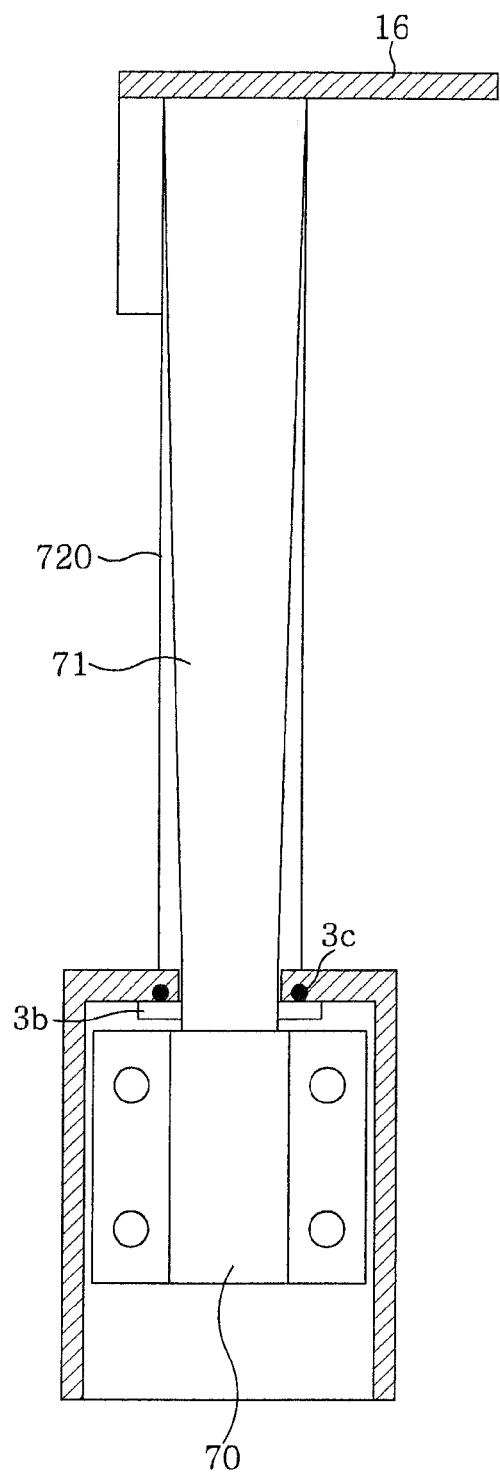
FIG. 18 partially shows main parts of the plasma etching apparatus shown in FIG. 17.
Figure 19:
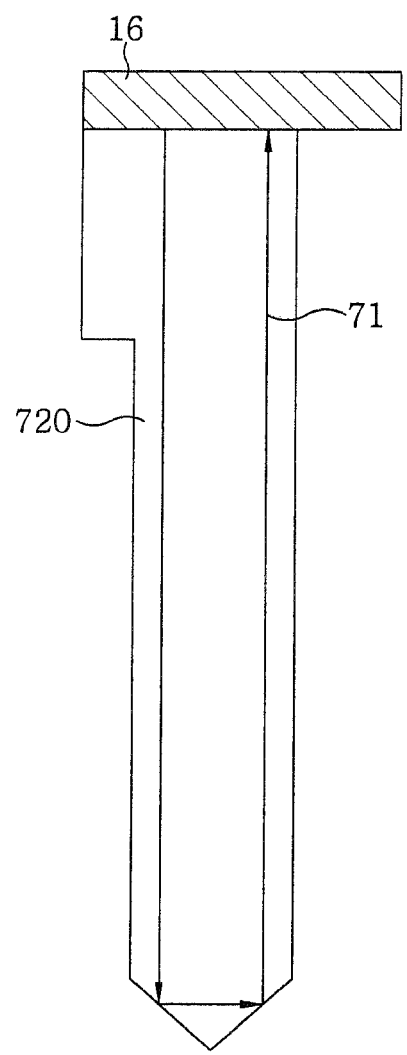
FIG. 19 partially shows main parts of the plasma etching apparatus shown in FIG. 17.

For example, a structure shown in FIGS. 17 and 18 can be employed to introduce the heating light 71 into the ring-shaped quartz member 720. In FIGS. 17 and 18, the same numerals are given to parts corresponding to those shown in FIG. 14. In FIGS. 17 and 18, a small-sized light source 70 is arranged adjacent to the bottom portion of the ring-shaped quartz member 720 and the heating light 71 is directly irradiated to the ring-shaped quartz member 720 through the window 3b for airtight sealing. In this case, a light source having an outside of, e.g., about 50 W may be employed as the small-sized light source 70. For example, 8 to 12 light sources 70 may be circumferentially arranged at regular intervals In the above structure, it is preferable that a concave cylindrical lens is employed as the window 3b and, thus, the heating light 71 is circumferentially enlarged. Further, it is preferable to provide a reflection unit at a bottom portion except for the window 3b for introduce the heating light 71, to suppress the heating light 71 from leaking to the outside. The reflection unit may be embodied by processing a bottom portion of the ring-shaped quartz member 720 to have a prism shape as shown in FIG. 19 for example, coating the bottom portion with a reflection film, or performing a fire-polish process or the like on the bottom portion.

Figure 20:
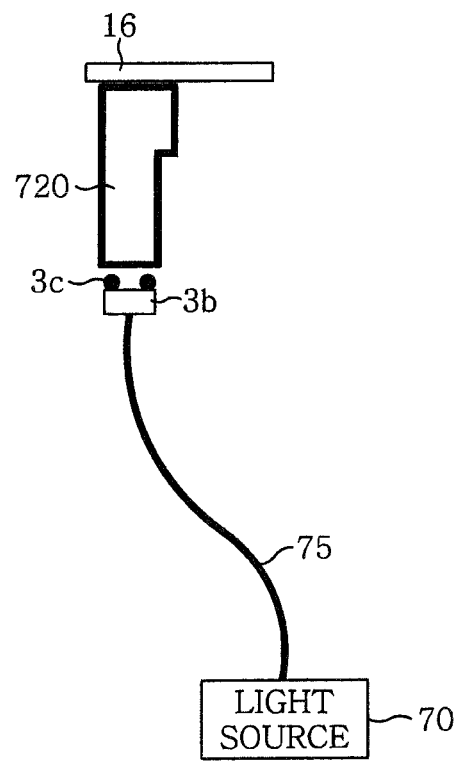
FIG. 20 shows main parts of a plasma etching apparatus in accordance with still another embodiment of the present invention.

For another example, a structure shown in FIG. 20 can be employed to introduce the heating light 71 into the ring-shaped quartz member 720. Specifically, the heating light 71 is introduced from the light source 70 having, e.g., LEDs into the optical fibers 75 while leading ends of the optical fibers 75 are arranged below the ring-shaped quartz member 720, to introduce the heating light 71 from the optical fibers 75 into the lower portion of the quartz member 720 through the window 3b.

Figure 21:
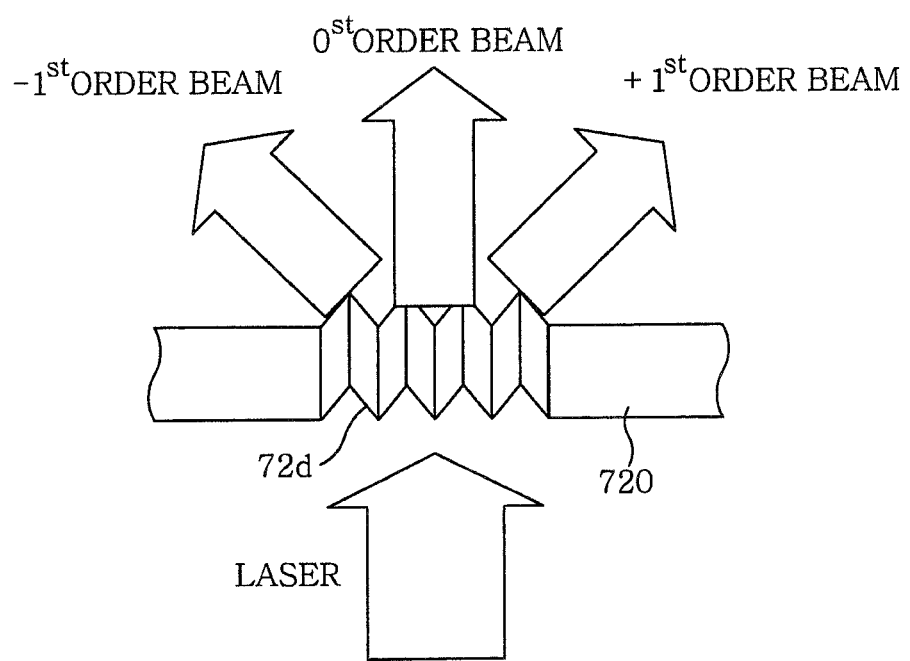
FIG. 21 shows main parts of a plasma etching apparatus in accordance with still another embodiment of the present invention.

As shown in FIG. 21, the diffusion unit 72d having a diffraction grating may be provided in the light introducing part 72a of the ring-shaped quartz member 720 to dividedly disperse the heating light 71 introduced in the ring-shaped quartz member 720 into a $-1^{st}$, a $0^{th}$, a $+1^{st}$ order light, and the like. In this case, such a dispersion state (diffraction angle) may be changed by adjusting the wavelength of the heating light 71 irradiated from the light source 70, thereby more uniformly dispersing the light 71 and uniformly heating the annular member 16.

Figure 22:
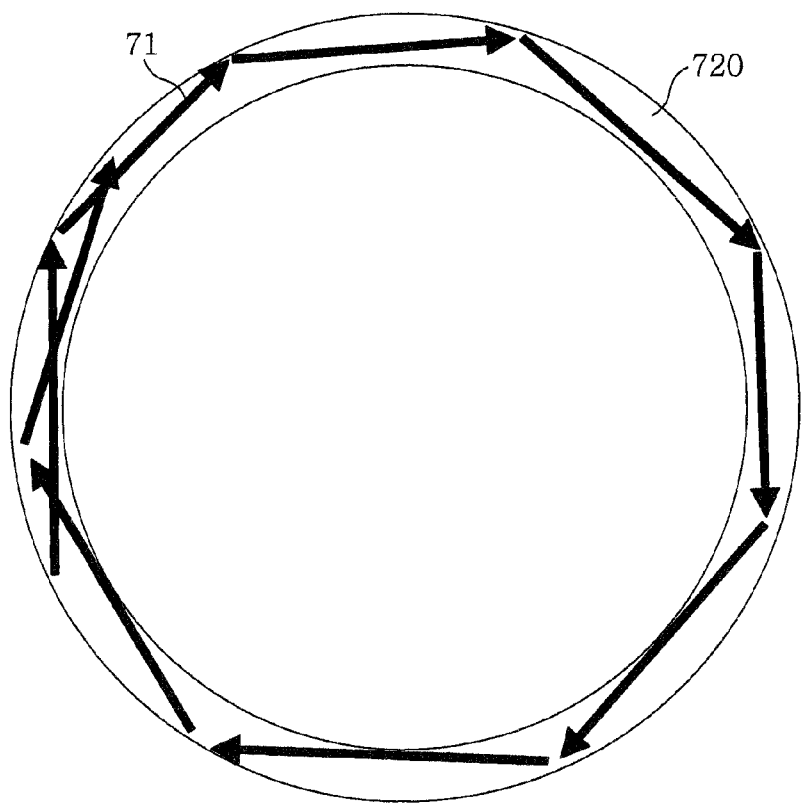
FIG. 22 shows how a heating light is propagated.
Figure 23:
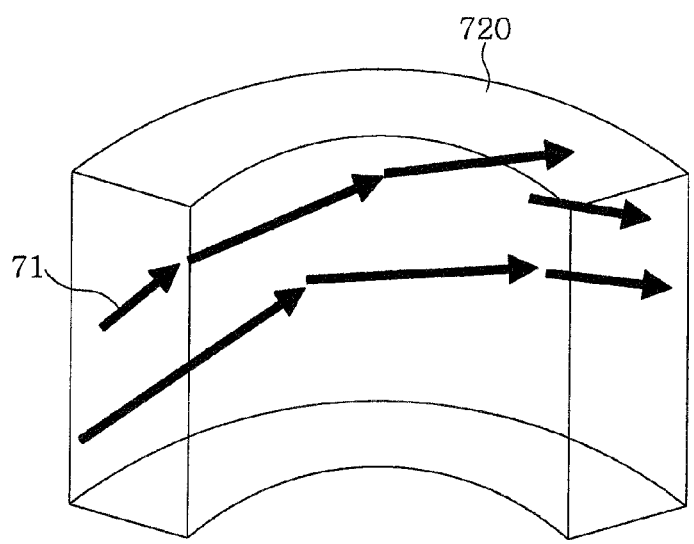
FIG. 23 shows how a heating light is propagated.

Instead of providing the reflection film 72c in the ring-shaped quartz member 720, the inner surface, the outer surface, and the bottom surface of the ring-shaped quartz member 720 may be polished into a mirror surface or subjected to the fire-polish process or the like. As shown in FIGS. 22 and 23, the heating light 71 may be introduced into the ring-shaped quartz member 720 under an incident condition (incident angle) that the heating light 71 is totally reflected on the inner surface of the ring-shaped quartz member 720.

Figure 24:
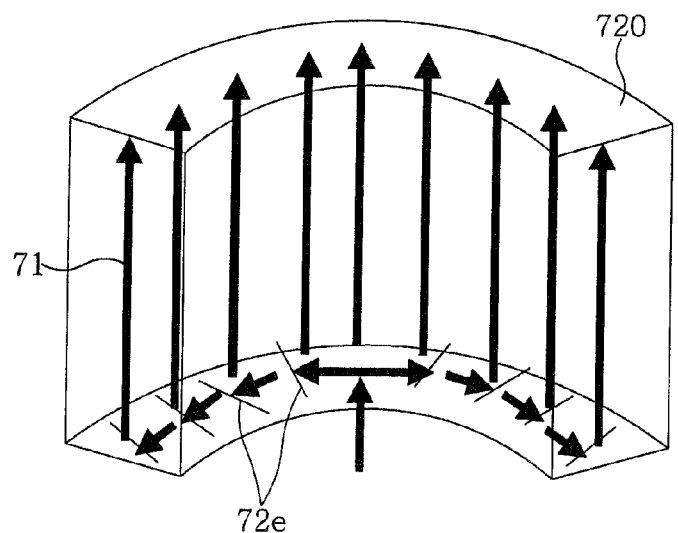
FIG. 24 shows main parts of a plasma etching apparatus in accordance with still another embodiment of the present invention.
Figure 25:
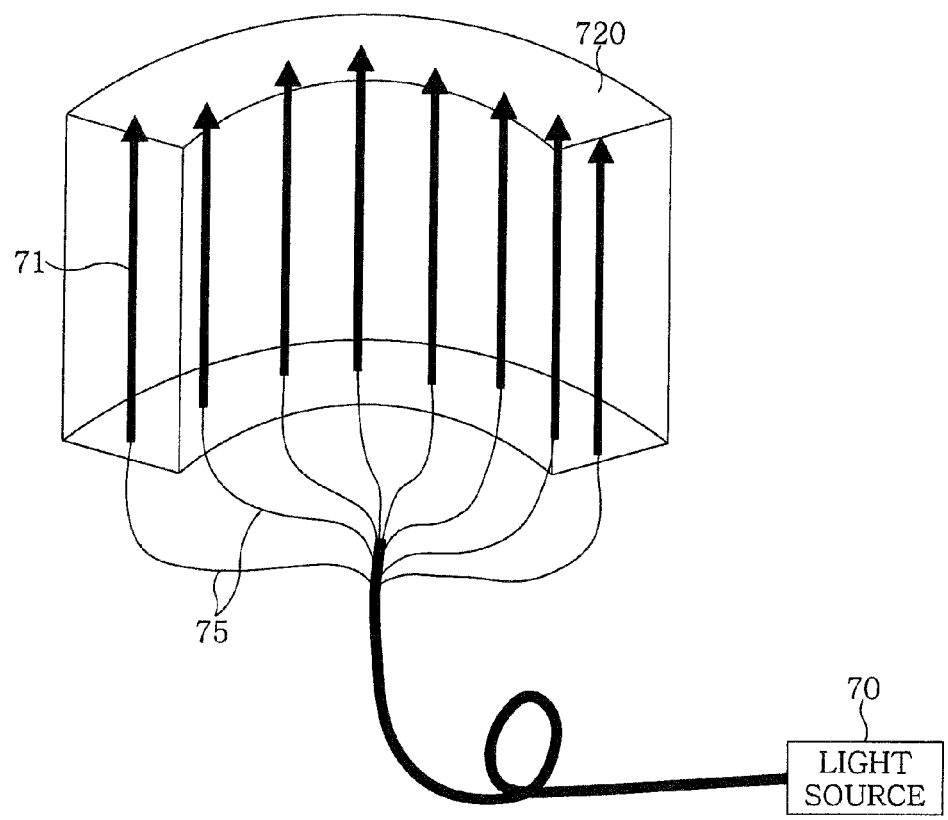
FIG. 25 shows main parts of a plasma etching apparatus in accordance with still another embodiment of the present invention.

Alternatively, as shown in FIG. 24, the beam splitters 72e may be provided inside the ring-shaped quartz member 720 to disperse little by little the circumferentially introduced heating light 71 such that the dispersed heating light 71 is directed upwardly (toward the annular member 16). Further alternatively, as shown in FIG. 25, the heating light 71 irradiated from the light source 70 may be dispersed by the optical fibers 75 to be introduced through a plurality of locations into the ring-shaped quartz member 720.

In the present embodiment, the heating light 71 dispersed from the ring-shaped quartz member 720 is supplied to the annular member 16. However, the heating light 71 may be propagated and totally reflected inside the annular member 16 as shown in FIGS. 26A to 27C for example. In this case, it is necessary to use a light having a wavelength that is longer than the fundamental absorption edge of silicon (a wavelength greater than 1050 nm) as the heating light 71 such that the heating light 71 is propagated inside the annular member 16.

Further, in this case, it is preferable to provide the reflection unit on a bottom surface of the annular member 16 or a top surface of the ring-shaped quartz member 720, except for the introduction portion of the heating light 71. As described above, the reflection unit can be embodied by providing a reflection film on the surface or performing a fire-polish process on the surface.

Figure 26A:
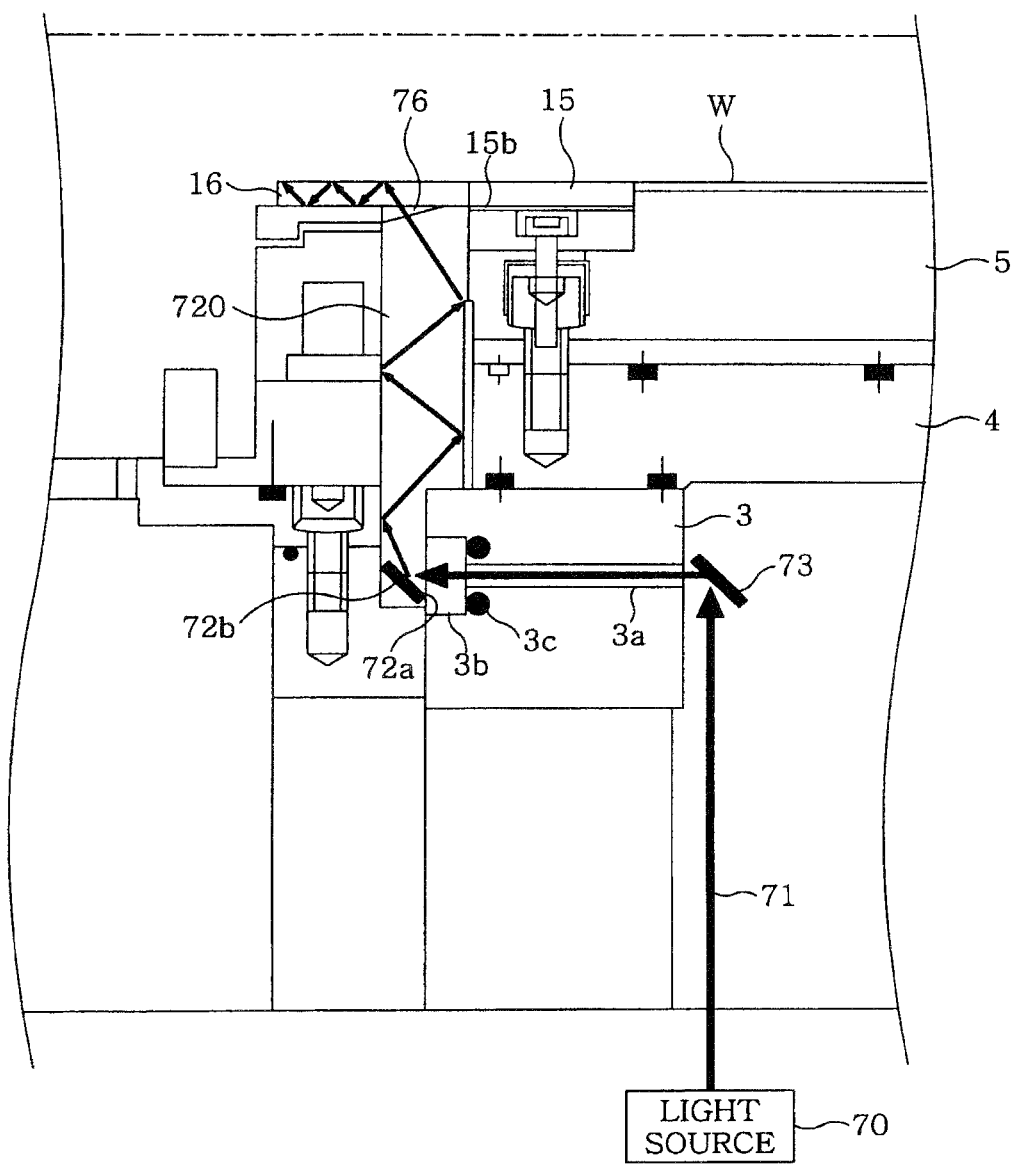
FIGS. 26A to 26C show main parts of a plasma etching apparatus in accordance with still another embodiment of the present invention.
Figure 26B:
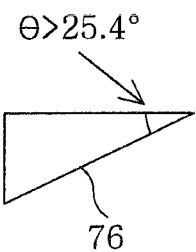
Figure 26C:
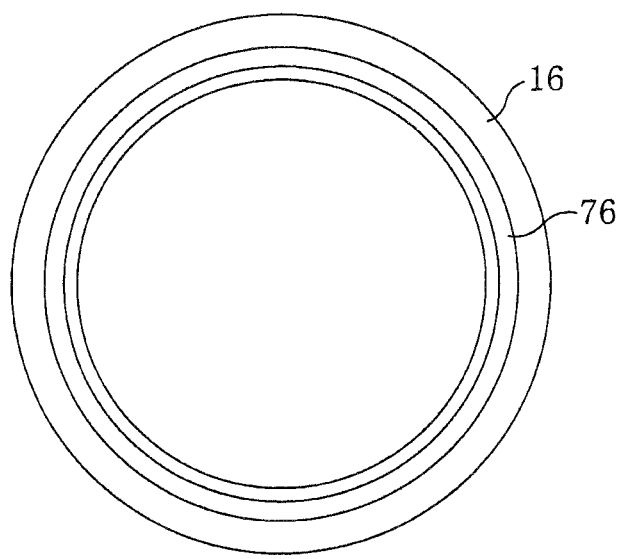

As shown in FIGS. 26A to 26C, the ring-shaped prism 76 made of a silicon material is provided between the ring-shaped quartz member 720 and the annular member 16. FIG. 26A is a cross sectional view showing main parts of the plasma etching apparatus 1a. FIG. 26B is a cross sectional view showing the prism 76. FIG. 26C is a plan view showing the annular member 16 and the prism 76.

As shown in FIG. 26B, an angle between an incident surface and a horizontal surface of the prism 76 is greater than 25.4° and, thus, the heating light 71 introduced in the annular member 16 through the prism 76 is propagated while being totally reflected inside the annular member 16 in a circumferential direction thereof. The angle of 25.4° is obtained by setting refractive indexes of silicon and quartz as 3.5 and 1.5, respectively.

Figure 27A:
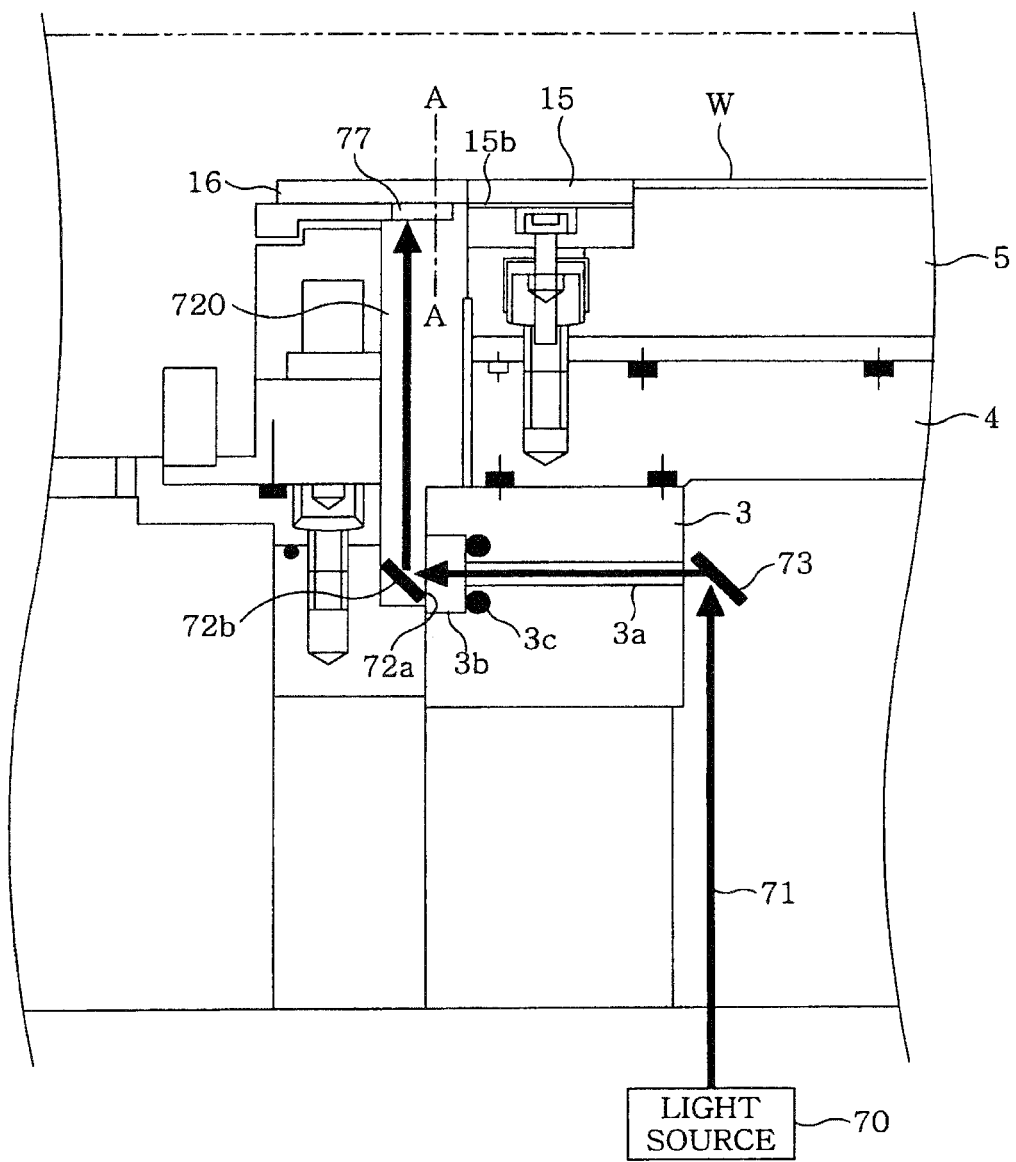
FIGS. 27A to 27C show main parts of a plasma etching apparatus in accordance with still another embodiment of the present invention.
Figure 27B:
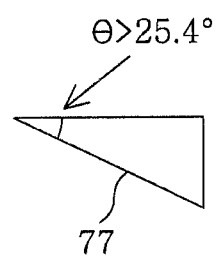
Figure 27C:
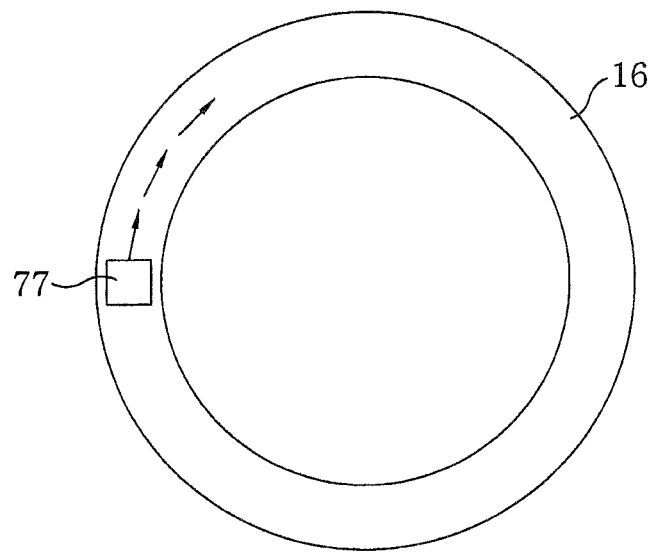

As shown in FIGS. 27A to 27C, the rectangular prism 77 made of a silicon material is provided between the ring-shaped quartz member 720 and the annular member 16. FIG. 27A is a cross sectional view showing main parts of the plasma etching apparatus 1a. FIG. 27B is a cross sectional view showing the prism 77 taken along a dotted line A-A shown in FIG. 27A. FIG. 27C is a plan view showing the annular member 16 and the prism 77.

By the prism 77, the heating light 71 is refracted in a circumferential direction of the annular member 16. In the cross section of the prism 77 taken along the dotted line A-A, an angle between an incident surface and a horizontal surface thereof is greater than 25.4°. Accordingly, the heating light 71 introduced in the annular member 16 through the prism 77 is propagated while being totally reflected in the circumferential direction inside the annular member 16. As described above, the angle of 25.4° is obtained by setting refractive indexes of silicon and quartz as 3.5 and 1.5, respectively.

Instead of providing the prism 76 or 77, a process for changing an optical path may be performed on the surface of at least one of the ring-shaped quartz member 720 and the annular member 16 to serve as a prism.

Figure 28:
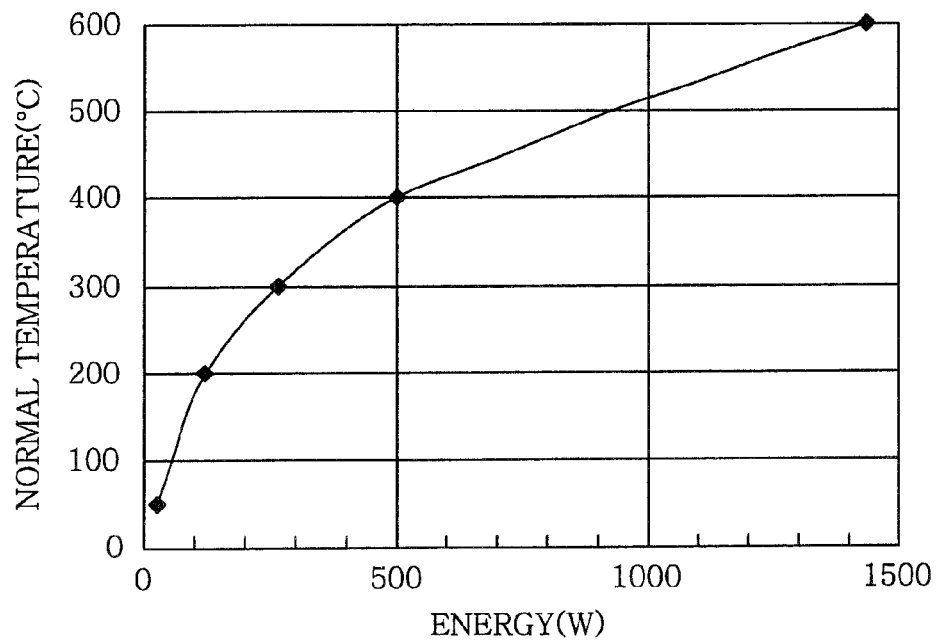
FIG. 28 is a graph showing a relationship between a supplied energy and a normal temperature.

A graph shown in FIG. 28 shows a relationship between a supplied energy and a normal temperature of the annular member 16 (having an outer diameter of 360 mm and an inner diameter of 340 mm), where the vertical axis indicates the normal temperature of the annular member 16 and the horizontal axis indicates the supplied energy. As shown in FIG. 28, energies of 125 W, 266 W, and 500 W are required to be supplied to the annular member 16 to heat it such that the temperatures thereof reach 200° C., 300° C., and 400° C., respectively.

Figure 29:
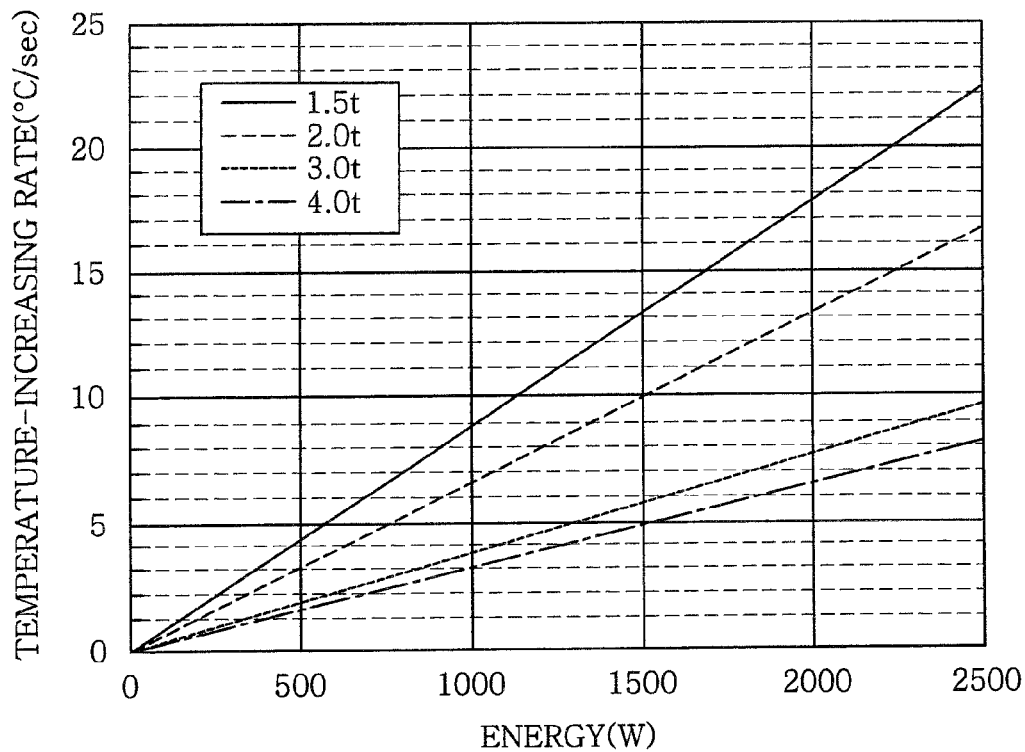
FIG. 29 is a graph showing a relationship between a supplied energy and a temperature-increasing rate.

Moreover, a graph shown in FIG. 29 shows a relationship between a supplied energy and a temperature-increasing rate of the annular member 16 (having an outer diameter of 360 mm and an inner diameter of 340 mm) when the thickness of the annular member 16 is 1.5, 2.0, 3.4, and 4.0 mm, where the vertical axis indicates the temperature-increasing rate of the annular member 16 and the horizontal axis indicates the supplied energy. As shown in FIG. 29, the temperature-increasing rate of the annular member 16 is varied depending on the thickness of the annular member 16. In case the annular member 16 has the thickness of 3.4 mm, the temperature-increasing rate thereof becomes about 1° C./sec when the supplied energy is 250 W.

Figure 30:
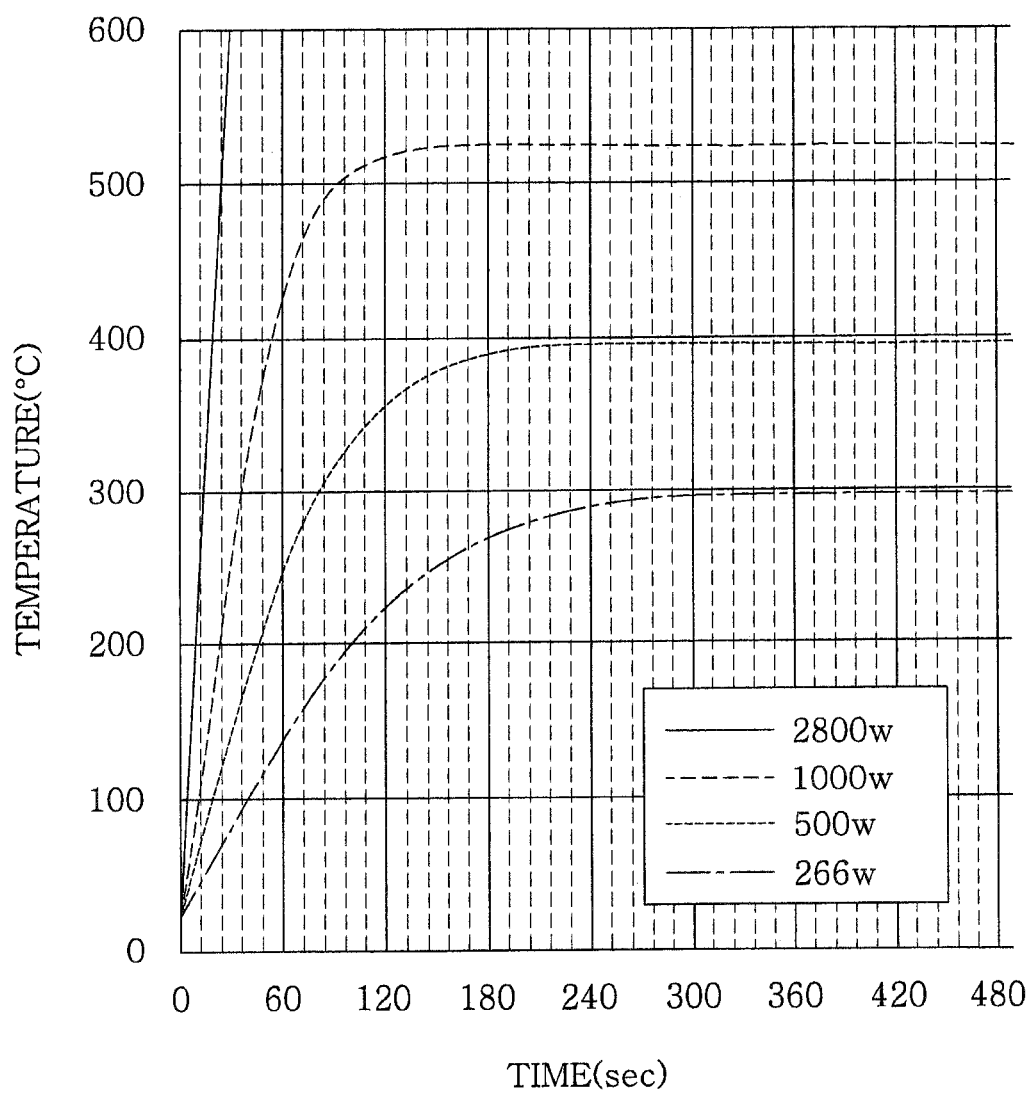
FIG. 30 is a graph showing a relationship between a heating time by each supplied energy and a temperature.
Figure 31:
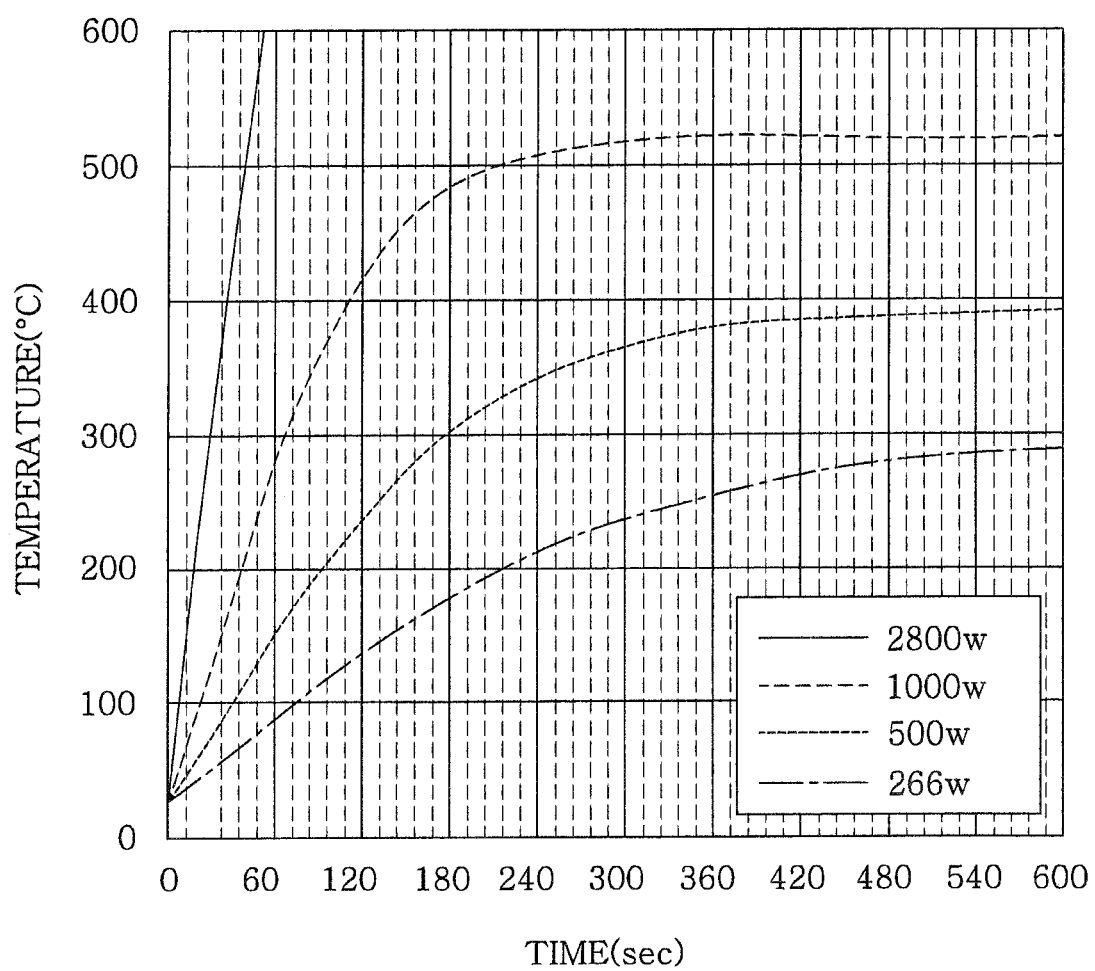
FIG. 31 is a graph showing a relationship between a heating time by each supplied energy and a temperature.

FIGS. 30 and 31 show temperature-increasing curves of the annular member 16, where the vertical axis indicates a temperature (° C.) and a horizontal axis indicates a time (second). Specifically, FIGS. 30 and 31 show the temperature-increasing curves when the thicknesses of annular member 16 are 1.5 mm and 3.4 mm, respectively. In the case of the annular member 16 having the thickness of 3.4 mm, the temperature thereof reaches about 300° C. after about 10 minutes by a light of 266 W as shown in FIG. 31.

Figure 32:
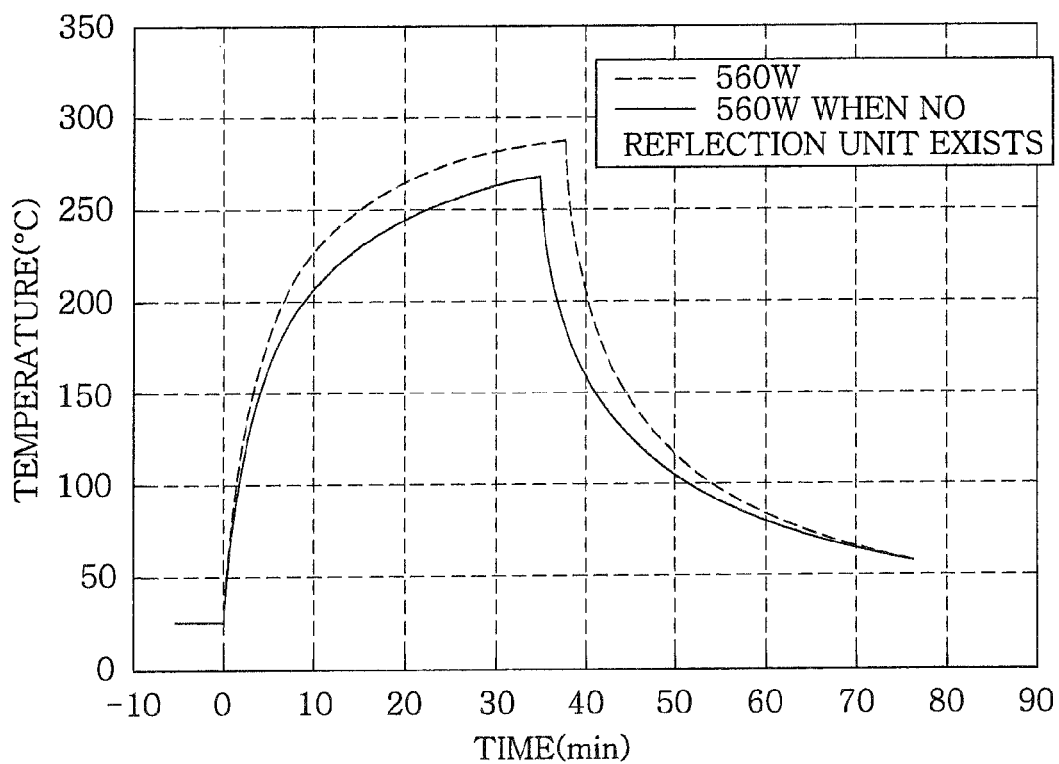
FIG. 32 is a graph showing a temperature difference according to whether or not a reflection unit exists.

FIG. 32 shows temperature-increasing curves of the annular member 16 having the outer diameter of 360 mm and the inner diameter of 340 mm when the annular member 16 is heated in the atmosphere, where the vertical axis indicates a temperature (° C.) and a horizontal axis indicates a time (minute). Specifically, the dotted-line curve shown in FIG. 31 shows the case where the reflection unit is provided at the bottom portion of the annular member 16 and a light of 560 W is employed, and the solid-line curve shows the case where there is no reflection unit and the light of 560 W is employed. As shown in FIG. 32, it is possible to improve the temperature-increasing rate and increase the normal temperature by providing the reflection unit.

As described above, in accordance with the present embodiment, it is possible to heat the annular member 16 provided at the peripheral portion of the focus ring 15 to make the temperature of the annular member 16 equal to or higher than 200° C. while cooling the focus ring 15 to make the temperature of the focus ring 15 lower than 200° C. Accordingly, a processing profile deterioration at a peripheral portion of the semiconductor wafer W can be prevented. As a result, it is possible to suppress the increase in etching rate of a photoresist at the peripheral portion of the semiconductor wafer W, thereby improving the in-plane uniformity of the plasma etching process.

Especially, from the time when the plasma etching apparatus 1a performs no process to the time when the apparatus 1a starts to perform the plasma etching process on the semiconductor wafer W, the annular member 16 is not exposed to a plasma. Accordingly, the temperature of the annular member 16 is kept at about a room temperature. In this state, when the plasma etching process is started while cooling the focus ring 15, due to the low temperature of the annular member 16, the etching rate of the photoresist at the peripheral portion of the semiconductor wafer W is increased and the selectivity is lowered, thereby deteriorating the in-plane uniformity of the plasma etching process.

On the other hand, since the annular member 16 is heated in advance such that the temperature thereof is made to be equal to or higher than 200° C. in the present embodiment, it is possible to suppress the increase in etching rate of the photoresist at the peripheral portion of the semiconductor wafer W immediately after the plasma etching process is started, thereby improving the in-plane uniformity of the plasma etching process.

Further, since the temperature of the annular member 16 during the plasma etching is changed depending on the plasma etching time, it is possible to control the temperature of the annular member 16 to be uniform by irradiating the heating light 71 to heat the annular member 16 while measuring the temperature of the annular member 16 with a thermometer. In this case, the temperature of the annular member 16 may be measured by the temperature measuring technique using a low coherence interferometer, and the light irradiated from the light source 70 may be also used for temperature measurement.

Moreover, the heating light 71 is irradiated from the light source 70 provided outerside of the vacuum processing chamber 2 to the annular member 16 through the ring-shaped quartz member 720 provided below the annular member 16. Accordingly, it is possible to make simpler the structure of the heating mechanism and suppress the increase of the manufacturing cost as compared with the case of requiring an inductive heating unit inside the annular member 16 and an induction coil inside the vacuum processing chamber, for example.

In each of the aforementioned embodiments, a reflection film may be provided on the inner surface, the outer surface, and the bottom surface of the ring-shaped quartz member 72 or 720, or the inner surface, the outer surface, and the bottom surface thereof may be polished into a mirror surface or subjected to the fire-polish process or the like to suppress the heating light 71 introduced in the ring-shaped quartz member 72 or 720 from leaking to the outside.

Figure 33:
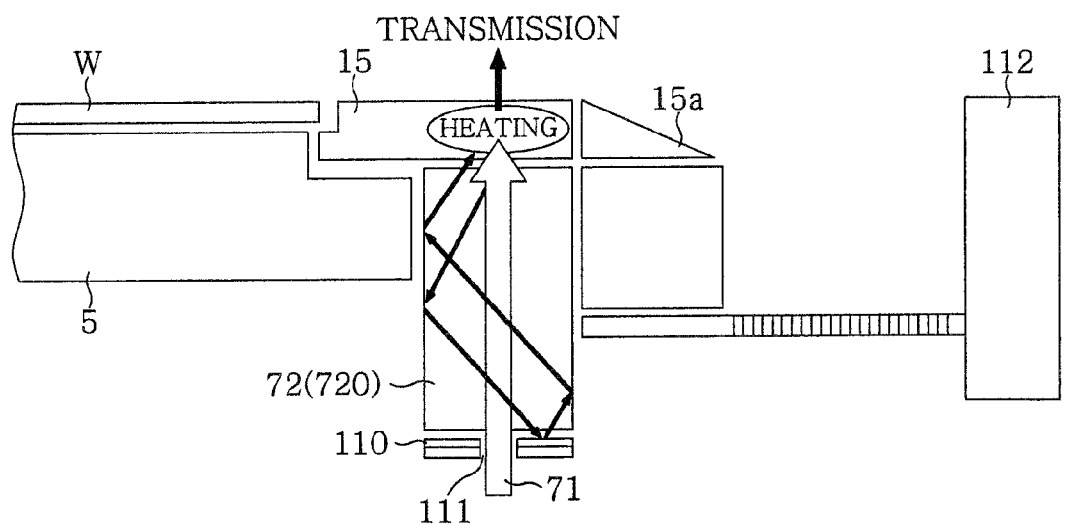
FIG. 33 shows main parts of a plasma etching apparatus in accordance with still another embodiment of the present invention.

Alternatively, a reflection mirror 110, for example, may provide adjacent to the ring-shaped quartz member 72 or 720 at outside thereof as shown in FIG. 33 instead of processing the surface of the ring-shaped quartz member 72 or 720 as described above.

In this case, it is more efficient to provide the reflection mirror 110 at the bottom surface of the ring-shaped quartz member 72 or 720 than the inner or the outer surface thereof. Accordingly, the reflection mirror 110 may be provided at the bottom surface of the ring-shaped quartz member 72 or 720 as shown in FIG. 33. In an example shown in FIG. 33, the reflection mirror 110 has a ring shape following the shape of the bottom surface of the ring-shaped quartz member 72 or 720. Further, one or more openings through which the heating light 71 is introduced are formed at a portion of the reflection mirror 110. The reference numeral 112 denotes a wall of the vacuum processing chamber in FIG. 33.

Figure 34:
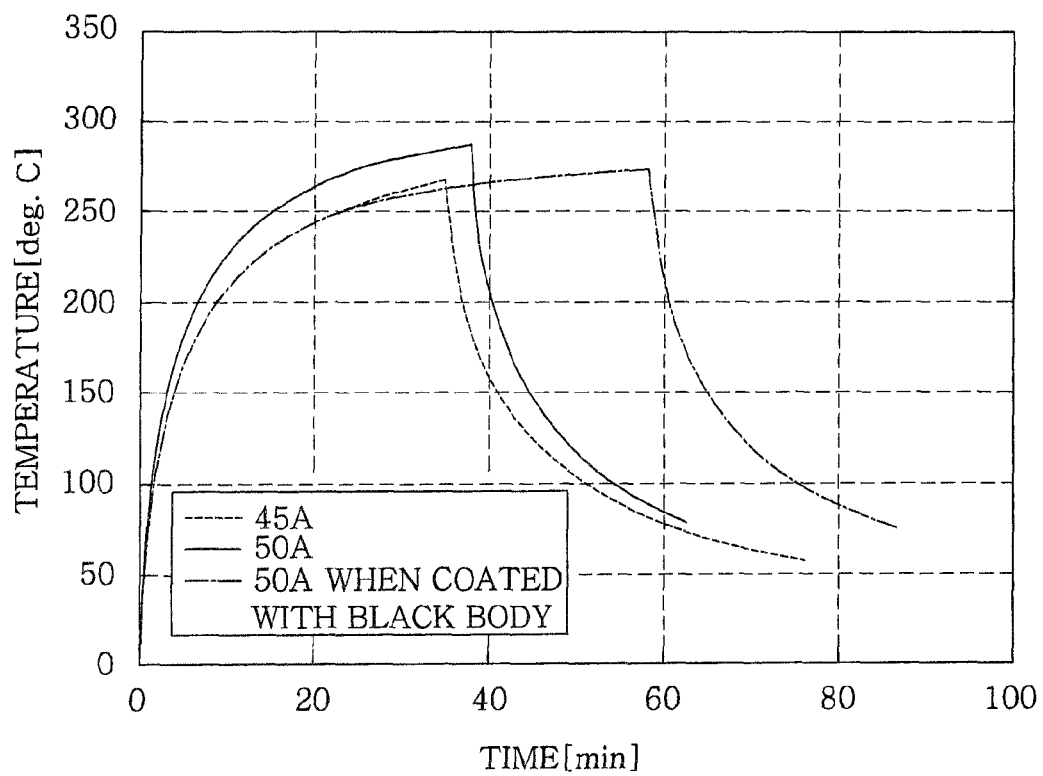
FIG. 34 is a graph showing a temperature difference according to whether or not a reflection mirror exists.

FIG. 34 is a graph showing the difference of the temperature of the focus ring 15 between the cases where the reflection is performed on the side of the bottom surface of the ring-shaped quartz member 72 or 720 by the reflection mirror 110 and no reflection is performed by coating a black body the bottom surface of the ring-shaped quartz member 72 or 720, where the vertical axis indicates a temperature (° C.) and a horizontal axis a time (minute). In FIG. 34, the solid-line curve shows the temperature of the focus ring 15 in a first case where the reflection mirror 110 is provided and electric current supplied to the light source 70 is 50 A; the dotted-line curve shows the temperature of the focus ring 15 in a second case where the reflection mirror 110 is provided and electric current supplied to the light source 70 is 45 A; and the dashed dotted-line curve shows the temperature of the focus ring 15 in a third case where the black body is coated and electric current supplied to the light source 70 is 50 A.

As shown in FIG. 34, the temperature of the focus ring 15 in the second case where the reflection mirror 110 is provided and the current of 45 A is supplied to the light source 70 is substantially same as that in the third case where no reflection mirror 110 is provided and the current of 50 A is supplied to the light source 70. Moreover, the temperature of the focus ring 15 in the first case where the reflection mirror 110 is provided and the current of 50 A is supplied to the light source 70 is higher, by 30° C. or more, than that in the third case where no reflection mirror 110 is provided and the current of 50 A is supplied to the light source 70.

As such, if the reflection mirror 110 is provided adjacent to the bottom surface of the ring-shaped quartz member 72 or 720, it is possible to efficiently heat the focus ring 15 (or the annular member 16). The reflection mirror 110 may be formed by polishing a surface of a metal, e.g., aluminum (Al) or gold (Au) or a metal-coating surface into a mirror surface.

To improve a heating efficiency of the focus ring 15 (or the annular member 16), a coating material for improving an absorbing effect by suppressing the reflection of the heating light 71 may be coated on the bottom surface of the focus ring 15 (or the annular member 16). In this case, a bottom anti-reflection coating film (e.g., a dielectric multi-layer film) for preventing the reflection of a light having the same wavelength as the heating light 71 may be employed.

Figure 35:
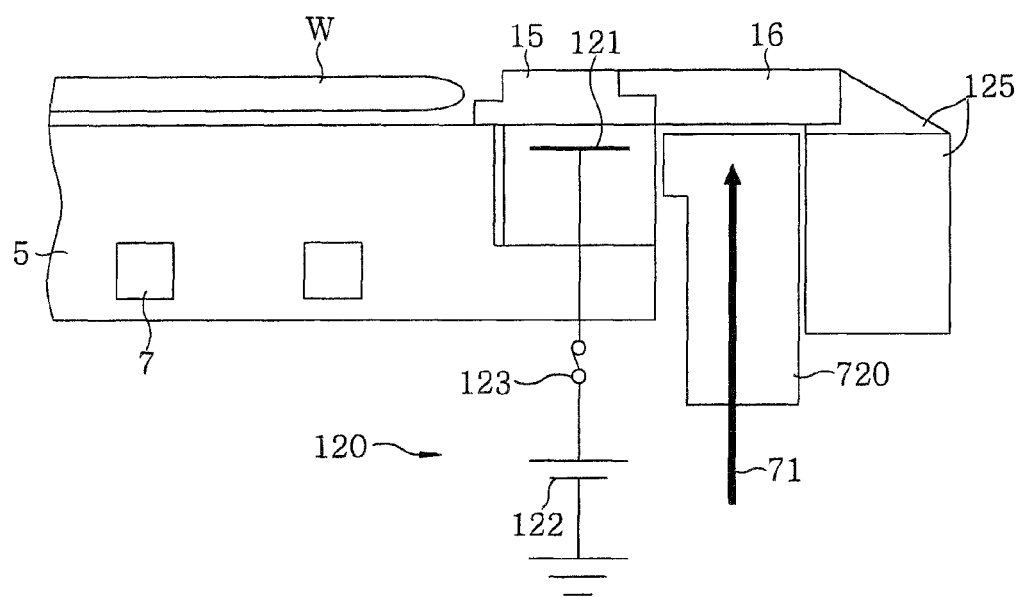
FIG. 35 shows main parts of a plasma etching apparatus in accordance with still another embodiment of the present invention.

FIG. 35 shows a structure capable of more efficiently cooling the focus ring 15 when the focus ring 15 is cooled and the annular member (cover ring) 16 provided at the peripheral portion of the focus ring 15 is heated. In an example shown in FIG. 35, there is provided an attracting unit 120 which attracts the focus ring 15 on the susceptor 5 by using a Johnson-Rahbek force. The attracting unit 120 includes an electrode 121 provided near the focus ring 15; a DC power supply 122 for supplying a DC voltage to the electrode 121; and a switch for switching on and off the DC voltage supplied from the DC power supply 122. The reference numeral 125 denotes a quartz member provided at a peripheral side of the annular member 16 and the ring-shaped quartz member 720 in FIG. 35.

As described above, it is possible to make the temperature of the focus ring 15 substantially same as that of the susceptor 5 by providing the attracting unit 120 which attracts the focus ring 15 by using the Johnson-Rahbek force to bring the focus ring 15 into close-contact with the susceptor 5. The temperature of the susceptor 5 is regularly controlled by a coolant circulating through the coolant path 7. Accordingly, it is possible to regularly control the temperature of the focus ring 15 at a high precision by providing the attracting unit 120.

Figure 36:
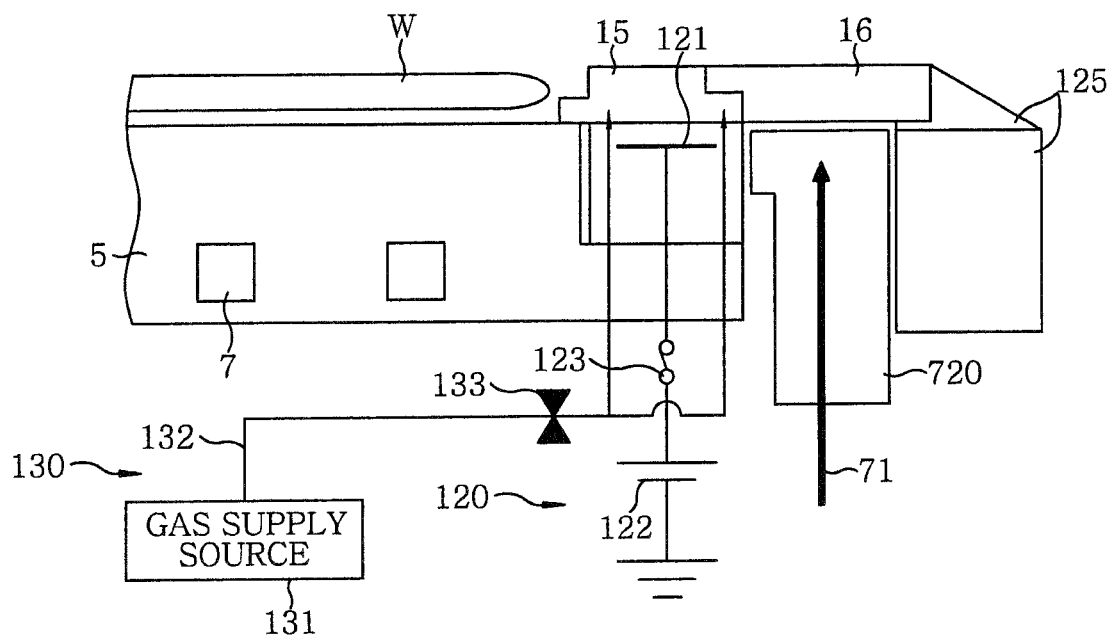
FIG. 36 shows main parts of a plasma etching apparatus in accordance with still another embodiment of the present invention.

The attracting unit 120 may use a Coulomb force instead of the Johnson-Rahbek force. The attracting unit 120 using the Coulomb force has a weaker attractive force than that of the attracting unit 120 using the Johnson-Rahbek force. For that reason, it is preferable to provide a gas supply unit 130 which supplies a heat transfer medium (e.g., He gas) for enhancing a heat conductivity between the susceptor 5 and a backside of the focus ring 15 as shown in FIG. 36, for example. The gas supply unit 130 includes a gas supply source 131; a gas flow path 132 through which the He gas or the like is introduced into a space between the susceptor 5 and the backside of the focus ring 15; and an on-off valve 133 for turning on and off the gas flow path 132.

Figure 37:
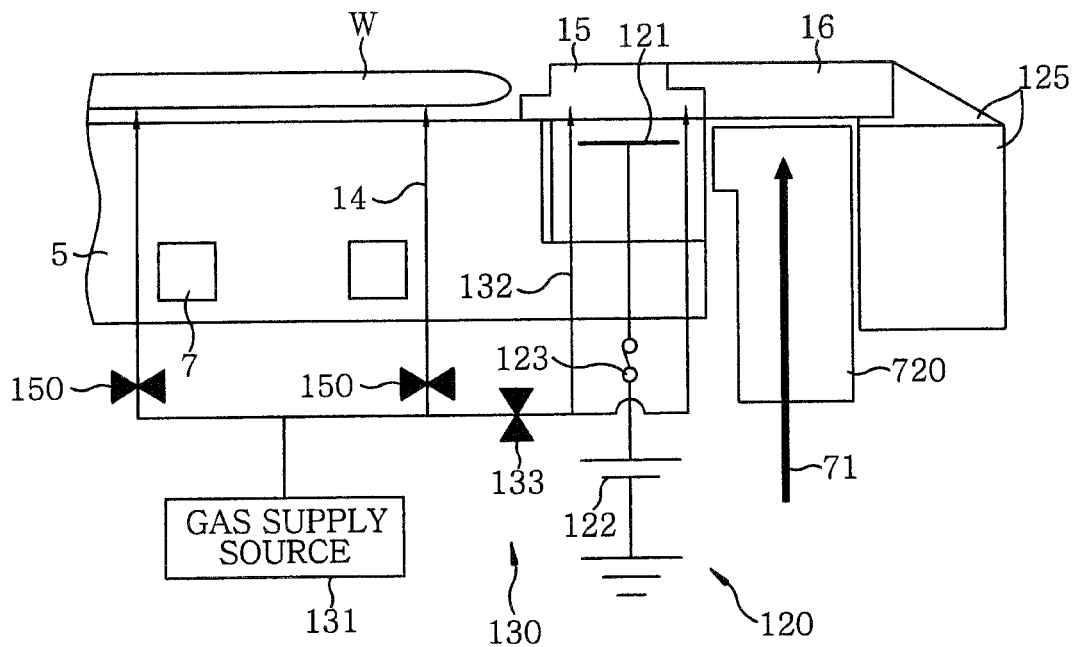
FIG. 37 shows main parts of a plasma etching apparatus in accordance with still another embodiment of the present invention.

The above-mentioned gas supply unit 130 may have an alternative structure shown in FIG. 37. Specifically, He gas or the like may be split from a cooling unit of the semiconductor wafer W which supplies it to a space between the susceptor 5 and a backside of the semiconductor wafer W through the gas channel 14 such that the split He gas is supplied to the space between the susceptor 5 and the backside of the focus ring 15. The reference numeral 150 denotes an on-off valve for turning on and off a gas supply path between the susceptor 5 and the backside of the semiconductor wafer W in FIG. 37.

Figure 38:
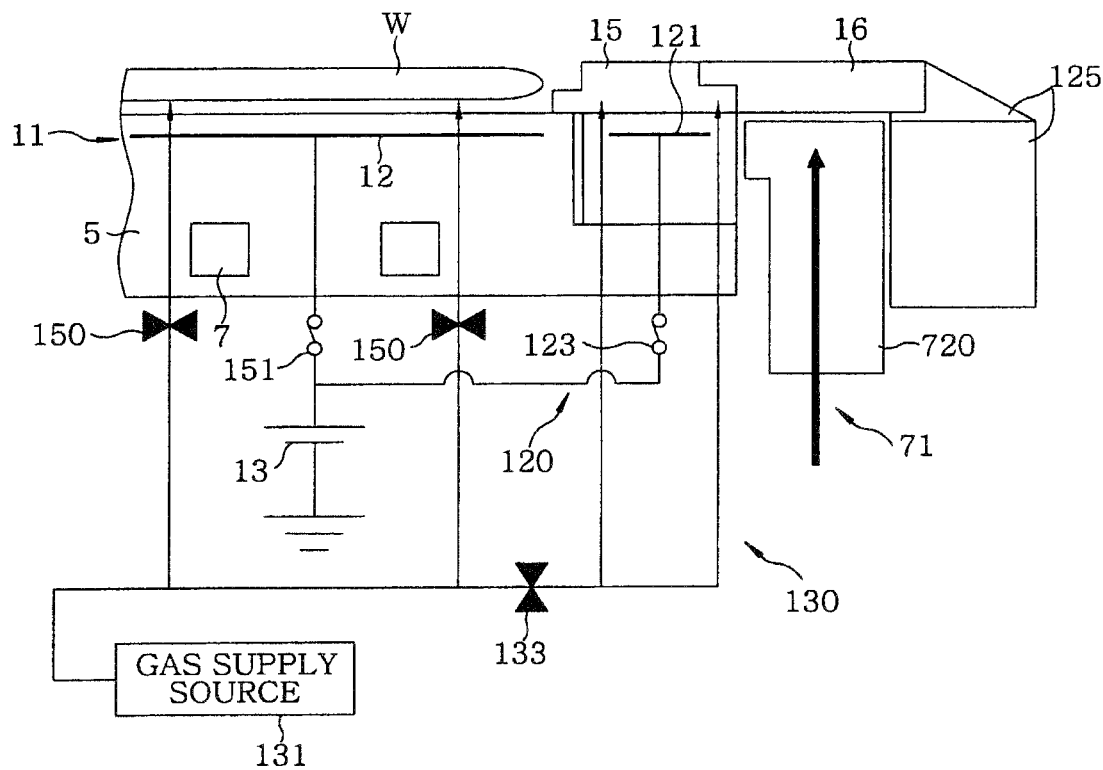
FIG. 38 shows main parts of a plasma etching apparatus in accordance with still another embodiment of the present invention.

In addition to the gas supply unit 130, the attracting unit 120 may also be have an alternative structure shown in FIG. 38 by commonly using the DC power supply 13 of the electrostatic chuck 11 to supply a DC power therefrom to the electrode 121. In this case, since the focus ring 15 is fixed until being replaced due to its erosion or the like, it is preferable to provide the switch 123 for switching on and off the voltage supplied to the electrode 121, to thereby switch on and off the voltage supplied from the DC power supply 13 independently from the electrostatic chuck 11. The reference numeral 151 denotes a switch for switching on and off the DC voltage supplied to the electrode 12 of the electrostatic chuck 11 in FIG. 38.

In accordance with each of the embodiments, the focus ring 15 or the annular member 16 is in a heat-insulating vacuum state under a high vacuum atmosphere when the focus ring 15 provided on the ring-shaped quartz member 72 is heated by supplying the heating light 71 thereto through the ring-shaped quartz member 72, or when the annular member 16 provided on the ring-shaped quartz member 720 is heated by supplying the heating light 71 thereto through the ring-shaped quartz member 720. Accordingly, the heat accumulated in the focus ring 15 or the annular member 16 is radiated and discharged to the outside.

In this case, since the ring-shaped quartz member 72 or 720 is arranged by being in contact with the focus ring 15 or the annular member 16, it becomes easier for the ring-shaped quartz member 72 or 720 to be heated by a heat radiated from the focus ring 15 or the annular member 16. Further, since the ring-shaped quartz members 72 and 720 are made of an insulating material, e.g., quartz, and in a heat-insulating vacuum state under a high vacuum atmosphere, no heat may be discharged to anywhere and, thus, the heat is kept in the ring-shaped quartz member 72 or 720.

If the temperature of the ring-shaped quartz member 72 or 720 becomes high due to the heat kept in the ring-shaped quartz member 72 or 720 as described above, this may affect a heating property of the focus ring 15 or the annular member 16. Accordingly, even though the heating light 71 is irradiated to the focus ring 15 or the annular member 16 under the same conditions, it becomes difficult to control the temperature thereof to a predetermined level.

Figure 39:
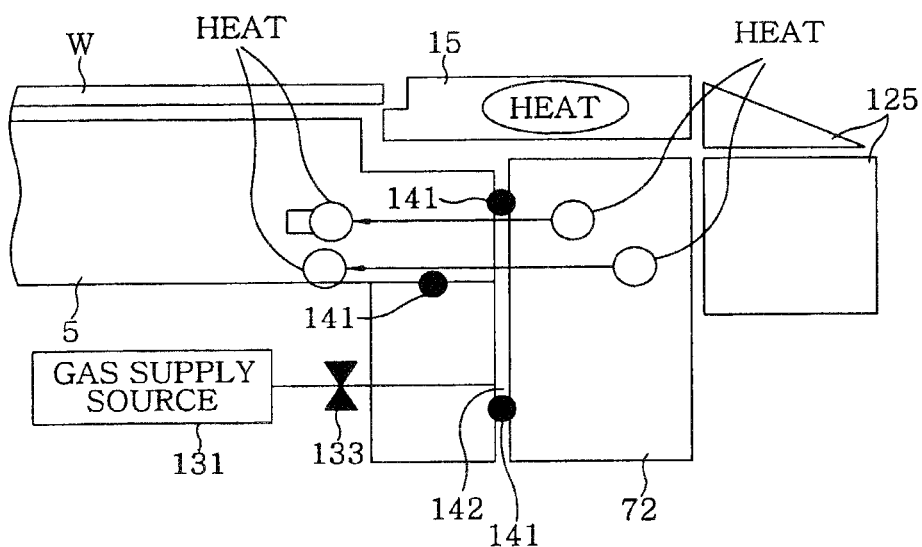
FIG. 39 shows main parts of a plasma etching apparatus in accordance with still another embodiment of the present invention.

For that reason, it is preferable to provide a mechanism for improving the heat transfer between the susceptor 5 and the ring-shaped quartz member 72 or 720. FIG. 39 shows an example of such a mechanism for improving the heat transfer. As shown in FIG. 39, a plurality of O-rings 141 is arranged, e.g., between the susceptor 5 and the ring-shaped quartz member 72, and airtightly closed spaces 142 are formed between the o-rings 141. The heat transfer gas, e.g., the He gas, is supplied from the gas supply source 131 to the spaces 142. In the above structure, the heat transferred from the focus ring 15 to the ring-shaped quartz member 72 is discharged to the susceptor 5 through the heat transfer gas, thereby preventing the undesired increase in the temperature of the ring-shaped quartz member 72.

Similarly, the same spaces 142 may be formed between the susceptor 5 and the ring-shaped quartz member 720 of the embodiment shown in FIGS. 35 to 38 and the heat transfer gas may be supplied to the spaces 142. In this case, the heat transferred from the annular member 16 to the ring-shaped quartz member 720 is discharged to the susceptor 5 through the heat transfer gas, thereby preventing the undesired increase in the temperature of the ring-shaped quartz member 720.

Figure 40A:
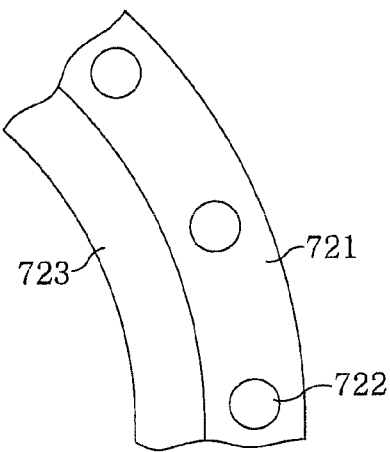
FIGS. 40A and 40B shows main parts of a plasma etching apparatus in accordance with still another embodiment of the present invention.
Figure 40B:
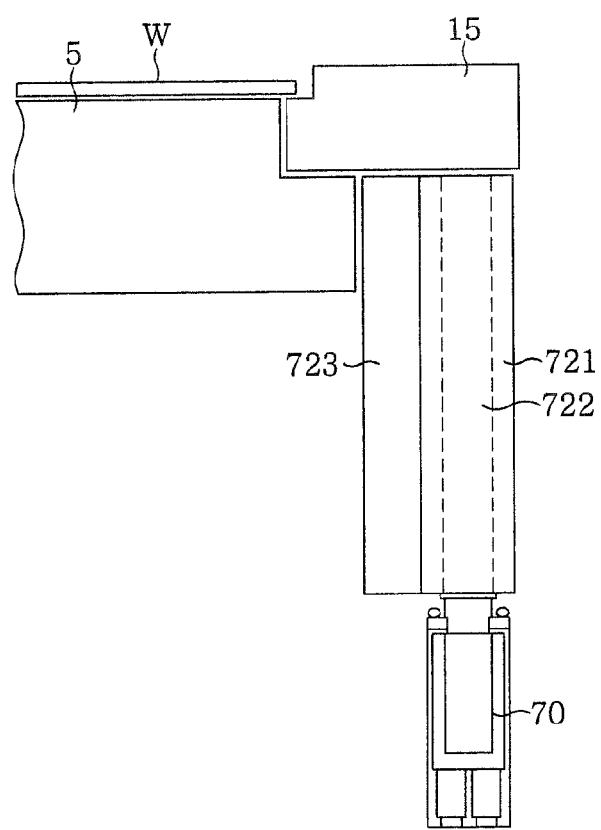

FIGS. 40A and 40B partially show main parts of a plasma etching apparatus in accordance with still another embodiment in which a plurality of cylindrical quartz member 722 buried in a ring-shaped insulating member 721 made of a ceramic or the like is employed as an optical path instead of the ring-shaped quartz member 72 or 720. Specifically, FIG. 40A is a top view partially showing the ring-shaped insulating member 721 and the cylindrical quartz member 722, and FIG. 40B is a cross sectional view showing the ring-shaped insulating member 721 and the cylindrical quartz member 722. The reference numeral 723 denotes an inner peripheral ring-shaped insulating member made of a ceramic or the like in FIGS. 40A and 40B.

In this embodiment, the light source 70 having LEDs is provided below each of the cylindrical quartz members 722 and the heating light 71 is supplied from the light source 70 to the focus ring 15 through the corresponding quartz member 722. Although FIGS. 40A and 40B show the structure in the case where the focus ring 15 is heated, the similar structure may be provided to heat the annular member 16. Instead of the cylindrical quartz members 722, there may be employed cylindrical members made of a different material, e.g., fused quartz, sapphire, transparent yttria, or an optical material formed of one of Ge, ZnSe, ZnS, GaAs, $CaF_2$, $BaF_2$, $MgF_2$, LiF, KBr, KCl, NaCl, and MgO.

The present invention is not limited to the above embodiments and various modifications may be made. For example, the plasma etching apparatus may be of a type in which single or dual high frequency powers are supplied to only the lower electrode or a type which uses a microwave plasma or an inductively coupled plasma without being limited to the parallel plate type in which high frequency powers are respectively supplied to the upper and the lower electrode as shown in FIGS. 1 and 13.

DESCRIPTION OF REFERENCE NUMERALS

1 Plasma etching apparatus
2 Vacuum processing chamber
5 Susceptor
15 Focus ring
70 Light source
71 Heating light
72 Ring-shaped quartz member
W Semiconductor wafer

What is claimed is:

1. A plasma etching apparatus comprising
a vacuum processing chamber;
a mounting table for mounting a substrate thereon, the mounting table being provided in the vacuum processing chamber;
a gas supply unit for supplying a processing gas to the vacuum processing chamber;
a unit for converting the processing gas to a plasma;
a focus ring provided to surround a periphery of the substrate;
an annular member provided to surround a periphery of the focus ring;
a cooling unit for cooling the focus ring; and
a heating mechanism for heating the annular member by irradiating a heating light from a light source thereto.

2. The apparatus of claim 1, wherein the cooling unit for cooling the focus ring also serves to cool the substrate mounted on the mounting table.

3. The apparatus of claim 1, wherein the light source is a laser beam source or a light emitting diode light source.

4. The apparatus of claim 1, further comprising: an insulating member provided below the annular member, the insulating member having a ring, a fan or a cylindrical shape and being made of a material allowing the heating light irradiated from the light source to pass therethrough,
wherein the insulating member allows the heating light to be transmitted to the annular member therethrough.

5. The apparatus of claim 4, wherein the insulating member is made of quartz, fused quartz, sapphire, transparent yttria, or an optical material formed of one of Ge, ZnSe, ZnS, GaAs, $CaF_2$, $BaF_2$, $MgF_2$, LiF, KBr, KCl, NaCl, and MgO.

6. The apparatus of claim 4, further comprising: a reflection unit provided on a bottom surface of the insulating member to reflect the heating light passing through the insulating member.

7. The apparatus of claim 6, wherein the reflection unit is formed by using a coating film or by processing a surface of the insulating member.

8. The apparatus of claim 4, wherein a reflection mirror is provided adjacent to a bottom surface of the insulating member, the reflection mirror having a reflection surface on the side of the insulating member.

9. The apparatus of claim 4, wherein an optical splitter is provided in the insulating member to split the heating light into a plurality of lights, and the annular member is heated by the split lights.

10. The apparatus of claim 4, wherein the heating light is introduced at a plurality of locations into the insulating member.

11. The apparatus of claim 4, wherein the heating light is introduced from the light source into the insulating member at a predetermined incidence angle.

12. The apparatus of claim 4, wherein a prism is provided between the insulating member and the annular member or a surface of at least one of the insulating member and the annular member is subjected to a process for changing an optical path to serve as a prism; and the heating light is allowed to be introduced through the prism in the annular member under an incident condition that the heating light is totally reflected on the surface of the annular member by the prism.

13. The apparatus of claim 4, wherein an airtightly closed space is formed between the insulating member and the mounting table, and a gas supply unit is provided to supply a heat transfer gas to the space.

14. The apparatus of claim 1, further comprising: an attracting unit for electrostatically attracting the focus ring on the mounting table.

15. The apparatus of claim 1, wherein the annular member is partially or entirely made of silicon or SiC, and
   wherein the heating light irradiated from the light source has a wavelength that is equal to or smaller than 1050 nm.

16. The apparatus of claim 1, wherein the heating light travels along an optical path from the light source directly toward the annular member.

17. The apparatus of claim 4, wherein the insulating member is provided directly below the annular member.

* * * * *